US008932894B2

(12) United States Patent
Christophersen et al.

(10) Patent No.: US 8,932,894 B2
(45) Date of Patent: Jan. 13, 2015

(54) METHODS AND SYSTEMS OF CURVED RADIATION DETECTOR FABRICATION

(75) Inventors: Marc Christophersen, Berwyn Heights, MD (US); Bernard F. Phlips, Great Falls, VA (US)

(73) Assignee: The United States of America, as represented by the Secratary of the Navy, Washington, DC (US)

( * ) Notice: Subject to any disclaimer, the term of this patent is extended or adjusted under 35 U.S.C. 154(b) by 633 days.

(21) Appl. No.: 12/581,469

(22) Filed: Oct. 19, 2009

(65) Prior Publication Data

US 2010/0264502 A1 Oct. 21, 2010

Related U.S. Application Data

(63) Continuation-in-part of application No. 12/195,594, filed on Aug. 21, 2008, now Pat. No. 8,372,578, which is a continuation of application No. 12/581,710, filed on Oct. 19, 2009, now Pat. No. 7,968,959.

(60) Provisional application No. 61/106,417, filed on Oct. 17, 2008, provisional application No. 61/106,460, filed on Oct. 17, 2008, provisional application No. 60/978,514, filed on Oct. 9, 2007.

(51) Int. Cl.
| | | |
|---|---|---|
| *H01L 21/00* | (2006.01) | |
| *H01L 31/115* | (2006.01) | |
| *H01L 31/0224* | (2006.01) | |
| *H01L 31/18* | (2006.01) | |

(52) U.S. Cl.
CPC .... *H01L 31/1804* (2013.01); *H01L 31/022408* (2013.01); *H01L 31/115* (2013.01); *Y02E 10/547* (2013.01)

USPC .......................................... 438/57; 257/429

(58) Field of Classification Search
USPC ................. 257/429, 447, E21.026, E31.038; 438/57, 60, 75, 524, 713, 719; 430/5
See application file for complete search history.

(56) References Cited

U.S. PATENT DOCUMENTS

| | | | | | |
|---|---|---|---|---|---|
| 3,607,449 | A | * | 9/1971 | Tokuyama et al. | 438/535 |
| 4,290,844 | A | * | 9/1981 | Rotolante et al. | 438/66 |

(Continued)

FOREIGN PATENT DOCUMENTS

| | | | | |
|---|---|---|---|---|
| DE | 10004891 A1 | 8/2001 | | |
| WO | WO02/31600 A1 | * | 4/2002 | G03F 7/36 |

(Continued)

OTHER PUBLICATIONS

Totsu, K., et al., Gray-Scale Lithography Using Mask-Less Exposure System, 13th International Conference on Solid-State Sensors, Actuators and Microsystems, Jun. 5-9, 2005, pp. 1441-1444.*

(Continued)

*Primary Examiner* — Whitney T Moore
*Assistant Examiner* — Joseph Galvin, III
(74) *Attorney, Agent, or Firm* — US Naval Research Laboratory; John Leonard Young

(57) ABSTRACT

Gray tone lithography is used to form curved silicon topographies for semiconductor based solid-state imaging devices. The imagers are curved to a specific curvature and shaped directly for the specific application; such as curved focal planes. The curvature of the backside is independent from the front surface, which allows thinning of the detector using standard semiconductor processing.

18 Claims, 21 Drawing Sheets

(56) References Cited

U.S. PATENT DOCUMENTS

| | | | |
|---|---|---|---|
| 5,310,623 A | | 5/1994 | Gal |
| 5,753,417 A | * | 5/1998 | Ulrich ............................ 430/312 |
| 5,940,460 A | * | 8/1999 | Seidel et al. ................... 376/153 |
| 5,969,359 A | * | 10/1999 | Ruddy et al. ............. 250/370.05 |
| 6,204,087 B1 | | 3/2001 | Parker |
| 6,259,085 B1 | * | 7/2001 | Holland ...................... 250/208.1 |
| 6,346,700 B1 | * | 2/2002 | Cunningham et al. ...... 250/214.1 |
| 6,693,225 B2 | * | 2/2004 | Boyer et al. ................... 585/265 |
| 6,849,843 B2 | | 2/2005 | Ansorge et al. |
| 6,985,184 B2 | | 1/2006 | Sato |
| 6,992,276 B2 | * | 1/2006 | Blauvelt et al. ............ 250/214.1 |
| 7,968,959 B2 | | 6/2011 | Christophersen et al. |
| 2001/0020671 A1 | * | 9/2001 | Ansorge et al. ............ 250/208.1 |
| 2002/0011639 A1 | * | 1/2002 | Carlson et al. ................. 257/443 |
| 2005/0109918 A1 | * | 5/2005 | Nikzad et al. .............. 250/208.1 |
| 2005/0173733 A1 | * | 8/2005 | Struder et al. ................. 257/202 |
| 2006/0008933 A1 | * | 1/2006 | Muller et al. ..................... 438/48 |
| 2006/0157733 A1 | * | 7/2006 | Lucovsky et al. ............. 257/192 |
| 2006/0180834 A1 | | 8/2006 | Holland |
| 2007/0045547 A1 | * | 3/2007 | Tumer ....................... 250/363.03 |
| 2009/0092934 A1 | | 4/2009 | Christophersen et al. |

FOREIGN PATENT DOCUMENTS

| | | |
|---|---|---|
| WO | PCT/US2009/061198 | 10/2009 |
| WO | PCT/US2009/061200 | 10/2009 |

OTHER PUBLICATIONS

Hartmann, R., et al., Design and Test at Room Temperature of the first Silicon Drift Detector with on-chip electronics, IEEE IEDM Tech Digest, 1994, pp. 535-538.*

Emilio Gatti and Pavel Rehak; An Application of a Novel Charge Transport Scheme; Nuclear Instruments and Methods in Physics Research; 1984; pp. 608-614; vol. 225; North-Holland Physics Publishing Division; Upton, New York; USA.

Rehak, Walton, Gatti, Kemmer, Dietl, Klanner, Lutz, Wylie, and Becker; Progress in Semiconductor Drift Detectors; Nuclear Instruments and Methods in Physics Research; 1986; pp. 367-378; vol. A248; Elsevier Science Publishers B.V. North-Holland Physics Publishing Division; Amsterdam.

Henke, Hoppe, Quenzer, Staudt-Fischback, and Wagner; Simulation assisted design of processes for gray-tone lithography; Microelectronic Engineering; 1995 pp. 267-270; vol. 27 Elsevier Science Publishers B.V.

Lechner, Eckbauer, Hartmann, Krisch, Hauff, Richter, Soltau, Struder, Fiorini, Gatti, Longoni, and Sampietro; Silicon drift detectors for high resolution room temperature X-ray spectroscopy; Nuclear Instruments and Methods in Physics Research; 1996; pp. 346-351; vol. A377; Elsevier Science B.V.

Castoldi, Guazzoni, Longoni, Gatti, Rehak, and Struder; Conception and Design Criteria of a Novel Silicon Device for the Measurement of Position and Energy of X Rays; IEEE Transactions on Nuclear Science; (Oct. 1997); pp. 1724-1732; vol. 44; No. 5; IEEE; USA.

Don Groom; Lateral diffusion in a partially depleted thick CCD; HiRho CCD Internal Note; Ernest Orlando Lawrence Berkeley National Laboratory; 1997; Berkeley, CA, USA.

Parker, Kenney, and Segal; 3D—A proposed new architecture for solid-state radiation detectors; Nuclear Instruments and Methods in Physics Research; 1997; pp. 328-343; vol. A395; Elsevier Science B.V.

ATLAS Users Manual: Device Simulation Software; (Nov. 1998); pp. 1-294; vol. II; SILVACO Int'l; Santa Clara, CA, USA.

Tull, Iwanczyk, Patt, and Barkan; High Efficiency Silicon X-Ray Detectors; IEEE Transactions on Nuclear Science; (Aug. 2004); pp. 1803-1807; vol. 51; No. 4; IEEE; USA.

Piemonte, Rashevsky, and Vacchi; Device simulation of the ALICE silicon drift detector; Microelectronics Journal; 2006; pp. 1629-1638; vol. 37 Elsevier.

Ackermann, McGraw, and Zimmer; Are curved focal planes necessary for wide-field survey telescopes?; Ground-based and Airborne Telescopes; Proceedings of SPIE; 2006; pp. 626740-1 through 626740-10; vol. 6267; SPIE.

Daniela Radtke, and Uwe D. Zeitner; Laser-lithography on non-planar surfaces; Optics Express; (Feb. 5, 2007); pp. 11671174; vol. 15; No. 3; Optical Society of America.

Li, Chen, Guo, Lissauer, Lynn, Radeka, and Pellegrini; Development, simulation and processing of new 3D Si detectors; Nuclear Instruments and Methods in Physics Research; 2007; pp. 139-148; vol. A583; Elsevier B.V.

Lothor Struder; Home made imaging X-ray detectors—high speed, low noise, low power, radiation hard, high Q. E.; (Feb. 7, 2007); pp. 1-36 and cover sheet; University of Siegen, Munich.

Bernard F. Phlips and Marc Christophersen; Curved Radiation Detector; IEE Nuclear Science Symposium Conference Record; 2008; pp. 2200-2205; IEEE; USA.

Marc Christophersen and Bernard Phlips; Gray-tone lithography using an optical diffuser and a contact aligner; Applied Physics Letters; 2008; pp. 194102-1 through 194102-3; vol. 92; American Institute of Physics.

Ko, Stoykovich, Song, Malyarchuk, Choi, Yu, Geddes III, Ziao, Wang, Huang, and Rogers; A hemispherical electronic eye camera based on compressible silicon optoelectronics; Nature Letters; (& Aug. 2008); pp. 748-753; vol. 454; Macmillan Publishers Ltd.

Rim Catrysse, Dinyari, Huang, and Peumans; The optical advantages of curved focal plane arrays; Optical Express: (Mar. 31, 2008); pp. 4965-4971; vol. 16; No. 7.

PNSensor: Research and Development; (accessed on the Internet, (Oct. 31, 2009)); pp. 1-34; [http://www.pnsensor.de/index.html].

Marc Christophersen and Bernard Phlips; Thick Silicon Drift Detectors; [presentation] Nuclear Science Symposium; (Oct. 19-25, 2008); pp. 1-23; US Naval Research Laboratory; USA.

Advanced Imaging Technology: Application-Specific Design Elements; MIT Lincoln Laboratory-Massachusetts Institute of Technology; (accessed on the Internet (Oct. 22, 2009)); [http://www.II.mit.edu/mission/electronics/AIT/Appspecific.html]; pp. 1-5; MIT.

International Search Report, Written Opinion and Preliminary Report on Patentability mailed Apr. 28, 2011 for PCT/US2009/061198 Curved Radiation Detector Fabrication Methods and Systems, Christophersen et al.

International Preliminary Report on Patentability mailed Apr. 28, 2011 for PCT/US2009/061200 Thick Semiconductor Drift Detector Fabrication, Christophersen et al.

International Search Report, Written Opinion mailed Dec. 24, 2009 for PCT/US2009/061200 Thick Semiconductor Drift Detector Fabrication, Christophersen et al.

Dumas et al., Curved infrared detectors: application to spectrometry and astronomy, High Energy, Optical, and Infrared Detectors for Astronomy IV, Proceedings of SPIE, vol. 7742, pp. 1-12, (2010).

Iwert et al., The challenge of highly curved monolithic imaging detectors, p. 1, ESO Oct. 9, 2009, Garching, Germany.

* cited by examiner

METHODS AND SYSTEMS OF CURVED RADIATION DETECTOR FABRICATION

RELATED APPLICATIONS

This U.S. patent application is related to U.S. provisional patent application No. 61/106,460 Methods and Systems of Thick Silicon Drift Detector Fabrication and to U.S. provisional patent application No. 61/106,417 Methods and Systems of Curved Radiation Detector Fabrication and, each provisional application having the same joint inventors and each provisional application filed on the same day (Oct. 17, 2008) are incorporated by reference herein in their entirety. Furthermore, this U.S. Patent Application is related to and a continuation in part of U.S. patent application Ser. No. 12/195,594, for Gray-Tone Lithography Using Optical Diffusers, filed on Aug. 21, 2008, now issued U.S. Pat. No. 8,372,578 (issued on Feb. 12, 2013), and U.S. Provisional Application for Patent 60/978,514, each incorporated by reference herein in their entirety, now U.S. Patent Application Publication No. US 2009/0092934. Additionally, this U.S. Patent application is related to and a continuation of U.S. patent application Ser. No. 12/581,710 now issued U.S. Pat. No. 7,968,959 issued on Jun. 28, 2011 (formerly U.S. provisional 61/106,460), for Methods and Systems of Thick Semiconductor Drift Detector Fabrication, filed on Oct. 19, 2009 and incorporated by reference herein in its entirety. Further, this U.S. patent application is related to Patent Cooperation Treaty application PCT/US2009/061200, for Thick Silicon Drift Detector Fabrication and Patent Cooperation Treaty application PCT/US2009/061198, for Curved Radiation Detector Fabrication Methods and Systems, both designating the United States as the International Searching Authority; both filed on Oct. 19, 2009 and incorporated by reference herein in their entirety. Applicants claim the benefit of domestic priority and international priority of the above listed U.S. Patents, U.S. Patent Applications, U.S. Provisional Applications for Patent(s) and/or PCT Applications, respectively.

FIELD OF THE INVENTION

The present invention relates to optical design advancements for astronomical or ground based telescopes and optical imaging systems including compact optical systems, such as cameras on unmanned areal vehicles (UAVs) and backup cameras for cars. More particularly, the present invention is directed to the fabrication of solid state optical components which correct for spherical and other optical aberrations due to flat focal plane detectors.

BACKGROUND OF THE INVENTION

Generally, optical imaging systems having flat focal plane sensors include a photon sensor, a telescope, and an electronic read out system. Focal surfaces are generally curved (see FIG. 1A), while detector arrays are generally flat (see FIG. 1B). Existing systems use electronic focal plane sensors and attempt to work around aberration limitations by using compensators that attempt to flatten a given wave front (see FIG. 1A and FIG. 1B as described in S. B. Rim, et al., "The optical advantages of curved focal plan arrays", Optics Express 16, (2008)). Furthermore, existing technologies use bending of thinned charge coupled device arrays (patented 2000 in Germany, DE10004891C2 by Astrium GmbH, EADS subdivision). Bending can easily lead to breakage of the optical device. Several academic groups use similar approaches, e.g. "A hemispherical electronic eye camera based on compressible silicon optoelectronics", University of Illinois at Urbana-Champaign, Nature, 454, 748, 2008.

Additional patents describe techniques where silicon is mechanically bent into a desired shape: U.S. Pat. No. 6,849, 843 B2, to Ansorge et al. describes the fabrication of a curved detector by bonding the sensing element to a flexible carrier substrate that can be bent to the desired curvature. US Patent Application Publication No. 2005/0109918 A1, to Nikzad et al. describes the use a deformable membrane as a curved detector. U.S. Pat. No. 6,985,184 B2, to Sato is motivated by the need for further miniaturization for cameras. According to Sato, a camera can be miniaturized by the use of a curved "pick-up surface". This patent describes the general camera but not how the curved surface from the "pick-up" system is formed. This patent cites the above mentioned U.S. Pat. No. 6,849,843 B2 to Ansorge et al. U.S. Pat. No. 6,259,085, to Holland describes the fully depleted backside illuminated charge coupled device array; and US Patent Application Publication 2006/0180834 A1, to Holland describes how to improve a fully depleted backside illuminated charge coupled device array design by enabling higher voltages.

State-of-the-art cameras, such as cameras on UAVs or backup cameras on automobiles are examples, of the tradeoff between field of view and weight. In addition they have insufficient spectral range and non-uniform illumination over the focal plane for a large field of view. This is due to their need for multiple lenses to correct for spherical and other optical aberrations due in part to relying on flat focal plane detectors. A simple curved focal plane (analogous to the human eye, where the retina acts as the curved focal plane) would allow for a very wide field-of-view without the aberrations encountered in a flat focal plane.

Therefore, the need exists for the development of optical detector devices which simplify adjoining optics in telescopes and which reduce occurrences of optical aberrations associated with large corrective optics used to conform to flat detectors.

Furthermore, the need exists for the development of curved CCD detectors, which match the contour of curved focal plane of an optical device such as a telescope.

Therefore, the need exists for a low cost fabrication method to produce a photon detector or focal plane array on a curved silicon surface without the need to mechanically bend a silicon substrate into a desired shape.

SUMMARY OF THE INVENTION

A method and system for a process and a product are implemented in the fabrication of a curved detector by shaping of silicon. A gray tone lithography operation is used in combination with a plasma etching operation to etch the silicon to a desired shape (i.e., physical configuration). Gray tone lithography is a way of photo sculpting resist films to create three dimensional (3D) profiles in photo resist via a low cost, short cycle time, single exposure process. Gray tone lithography in combination with reactive ion etching (RIE) and deep reactive ion etching (DRIE) allow the resist profiles to be transformed into 3D silicon structures. The combination of gray tone lithography and a dry reactive ion etch process is called gray tone technology.

When the silicon is shaped accordingly to the need radius of curvature, the focal plane array is fabricated using standard silicon micro fabrication operations, thus producing a gamma ray detector on a curved silicon surface.

After transferring the resist profile into silicon a single sided strip detector is fabricated by ion implantation. The lithography operations are performed with a spray on resist.

Even though the surface is not as smooth as a planar wafer, good charge collection is achieved. A pixel array is fabricated on a half pipe. The energy resolution is 2.53 kiloelectron volts (keV) FWM at 59 keV.

DETAILED DESCRIPTION OF THE INVENTION

Figure 1A:
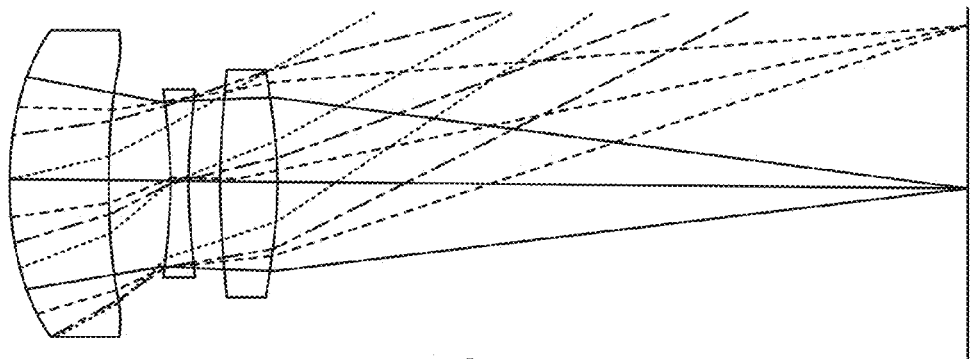
FIG. 1A illustrates a multi component optics configuration with a flat focal plane array.
Figure 1B:
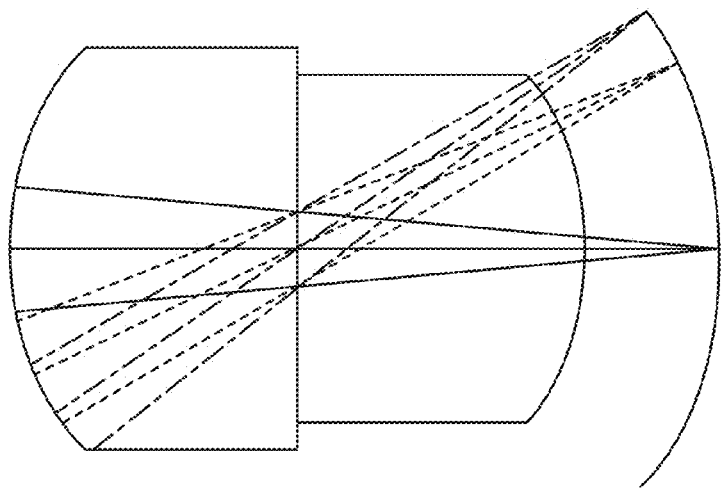
FIG. 1B illustrates a one lens system with a curved focal plane array.

Preferred exemplary embodiments are now described with reference to the figures, in which like reference numerals are generally used to indicate identical or functionally similar elements. While specific details of the preferred exemplary embodiments are discussed, it should be understood that this is done for illustrative purposes only. A person skilled in the relevant art will recognize that other configurations and arrangements can be used without departing from the spirit and scope of the preferred exemplary embodiments. It will also be apparent to a person skilled in the relevant art that this invention can also be employed in other applications. Further, the terms "a", "an", "first", "second" and "third" etc. used herein do not denote limitations of quantity, but rather denote the presence of one or more of the referenced items(s).

An exemplary embodiment discussed herein describes a method for fabricating a focal plane array, on a curved silicon surface. The basic idea is to use "gray-tone" lithography in combination with a plasma etching technique, a low-cost process, to shape the silicon surface. After the silicon "shaping" the detector array is fabricated on the silicon substrate, using standard CMOS (complementary metal-oxide-semiconductor) or CCD (Charge coupled device) processing. Other embodiments include curved charge particle detectors for high-energy physics experiments and curved X-ray focal plane arrays.

In accordance with exemplary embodiments, a method and system for a process and a product are implemented in the fabrication of a curved detector by shaping of silicon. A gray tone lithography operation is used in combination with a plasma etching operation to etch the silicon to a desired shape (i.e., physical configuration). Gray tone lithography is used to form curved silicon topographies for vertex detectors having layers with a full circular symmetry.

Figure 2:
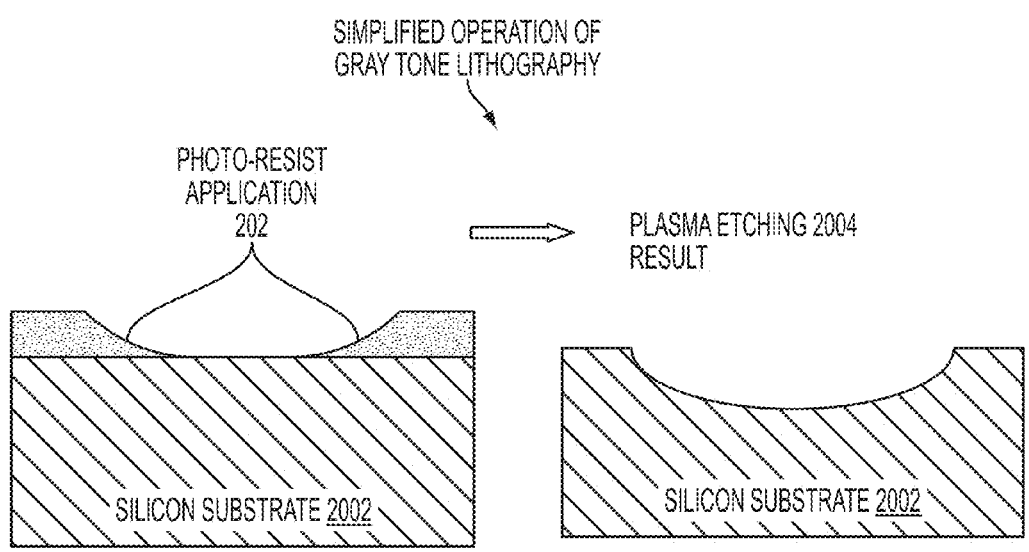
FIG. 2 illustrates the principle of gray tone technology, where a 3D resist profile is directly transferred into silicon topography.
Figure 3:
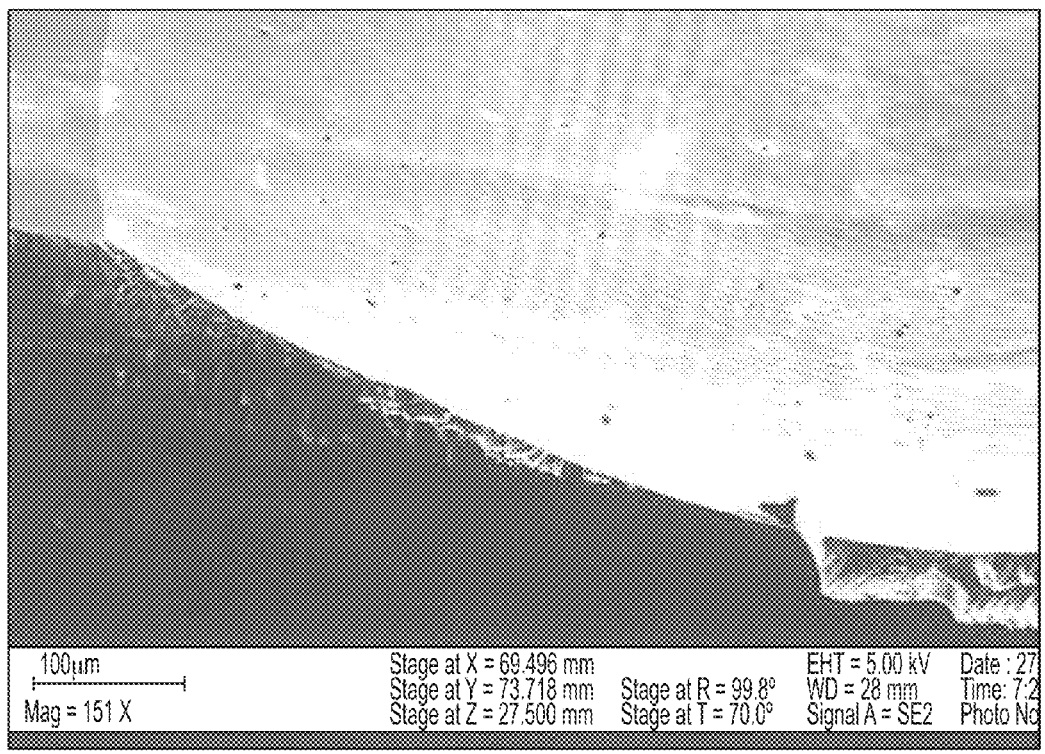
FIG. 3 illustrates a SEM micrograph (birds eye view) of a curved silicon surface.

Referring to FIG. 2, in the exemplary embodiments, gray tone lithography is a way of photo sculpting resist films to create three dimensional (3D) profiles in photo resist via a low cost, short cycle time, single exposure process. Gray tone lithography in combination with reactive ion etching (RIE) and deep reactive ion etching (DRIE) allows the resist profiles to be transformed into 3D silicon structures and/or topographies (See FIG. 2). According to related U.S. patent application Ser. No. 12/195,594 to Christophersen et al., the combination of gray tone lithography and a dry reactive etch process is called gray tone technology (See related U.S. patent application Ser. No. 12/195,594, paragraph [0035] lines 3-4; also, see related U.S. Pat. No. 7,968,959 (also to Christophersen), in paragraph [0035], at the third line from the bottom of the paragraph, wherein the related U.S. Patent Application and the related issued U.S. Patent are both incorporated by reference herein in their entirety). FIG. 3 shows an etched silicon surface, from a scanning electron microscope (SEM) micrograph bird's-eye-vies of a curved silicon surface.

CREATION OF CURVED RESIST PROFILE AND TRANSFER ONTO SUBSTRATE: As discussed in the above related applications section of the instant application, related patent application Ser. No. 12/581,710 to Christophersen, for Methods and Systems of Thick Semiconductor Drift Detector Fabrication, now U.S. Pat. No. 7,968,959 (hereafter "U.S. Pat. No. 7,968,959") is incorporated by reference in its entirety. In addition, pursuant to 37 CFR 1.57, material from U.S. Pat. No. 7,968,959, which is essential for completeness of the specification and enablement of the instant application and which was previously incorporated by reference is inserted into the specification as follows and contains no new matter: according to U.S. Pat. No. 7,968,959, gray tone lithography is used to structure a plurality of photo-resist thicknesses (U.S. Pat. No. 7,968,959[col. 4, ll. 66-67]). In other words, gray tone lithography is a cost effective way to produce reproducable 3D photo resist patterns with continuously varying depth of the photo resist pattern, where it follows inherently that these patterns either form the final structure or are used as masks or molds which are transferred into the appropriate semiconducting material, where it further follows that gray tone technology inherently facilitates creation of 3D curved structures, based on the different depth photo resist patterns. Furthermore, gray-tone lithography is a method of directing an exposing light through an optical diffuser to produce diffused light; directing the diffused light through a photomask having transparent areas corresponding to a gray-tone pattern to produce masked light; directing the masked light onto a photoresist material on a substrate; and developing the photoresist to produce a three dimensional structure in the photoresist, where the resulting 3D photo resists are then utilized in a replication process to transfer the resist pattern into an optical polymer, the final diffuser. The exposed photoresist may be developed, according to methods appropriate to the photoresist used, to produce a three dimensional structure in the photoresist. The developed photoresist may be processed, for example by etching, to reproduce a scaled version of the three dimensional structure on the substrate. As the etch proceeds, the photoresist mask slowly erodes, exposing the underlying silicon to the high etch rate plasma. Thus, gray-tone technology relies on specifically developed DRIE recipes to control the relative etch rate of silicon to photoresist, called "etch selectivity," to define the final vertical dimensions of a 3D structure in silicon. (see related U.S. Patent Application Publication herein incorporated by reference US 2009/0092934, paragraphs [0011], [0038], [0039], [0040], [0041], [0044], [0048], [0049], and [0050] and FIG. 2).

In addition, pursuant to 37 CFR 1.57, material from related U.S. Pat. No. 7,968,959, which is essential for completeness of the specification and enablement of the instant application and which was previously incorporated by reference is inserted into the specification as follows and contains no new matter: according to U.S. Pat. No. 7,968,959, in exemplary embodiments, referring to FIG. 16, the combination of gray tone lithography and dry etching can be applied to any semiconducting material, silicon being the most prominent (U.S. Pat. No. 7,968,959[col. 5, ll. 1-15]).

Figure 8:
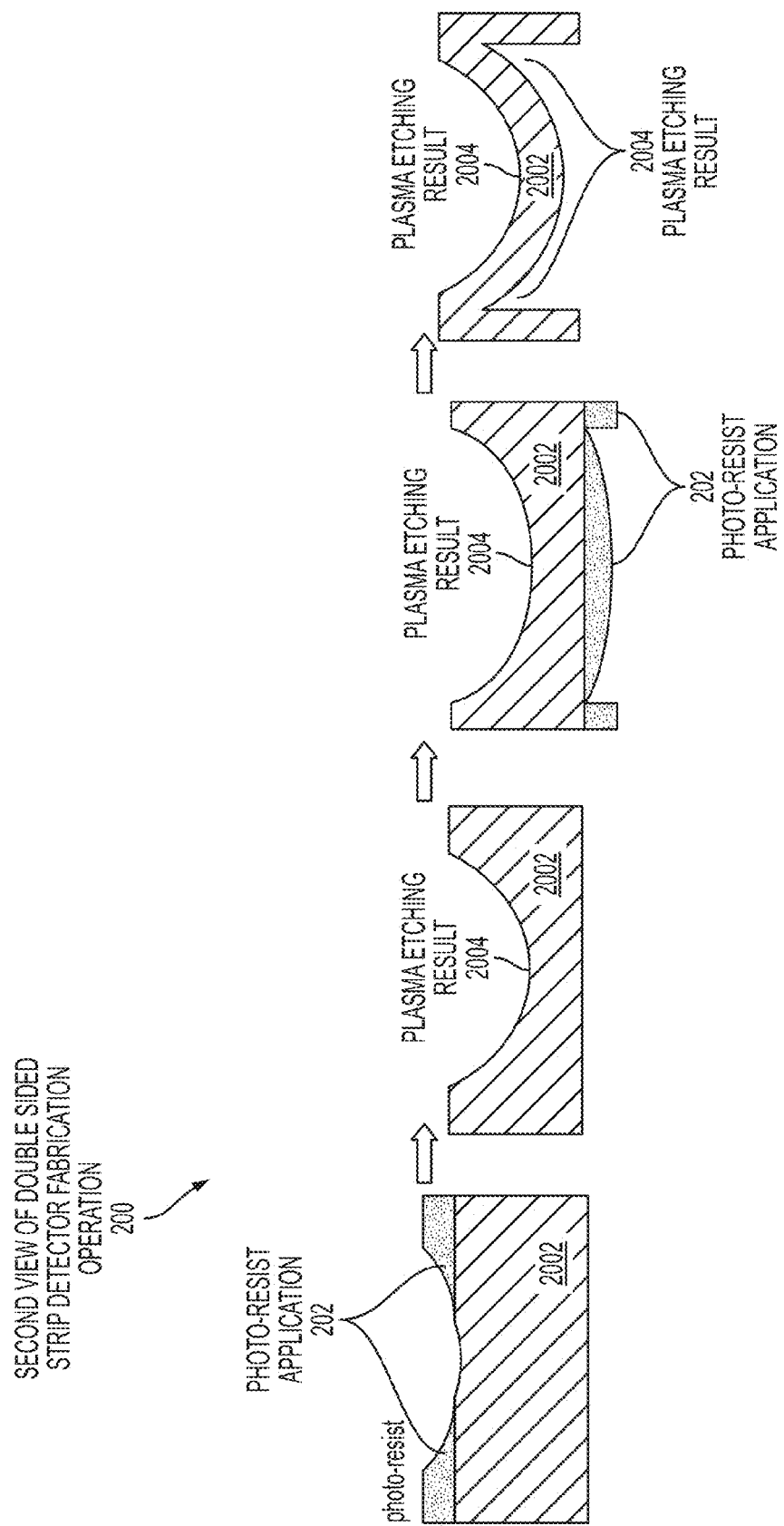
FIG. 8 illustrates gray-tone technology double-side processing.
Figure 9:
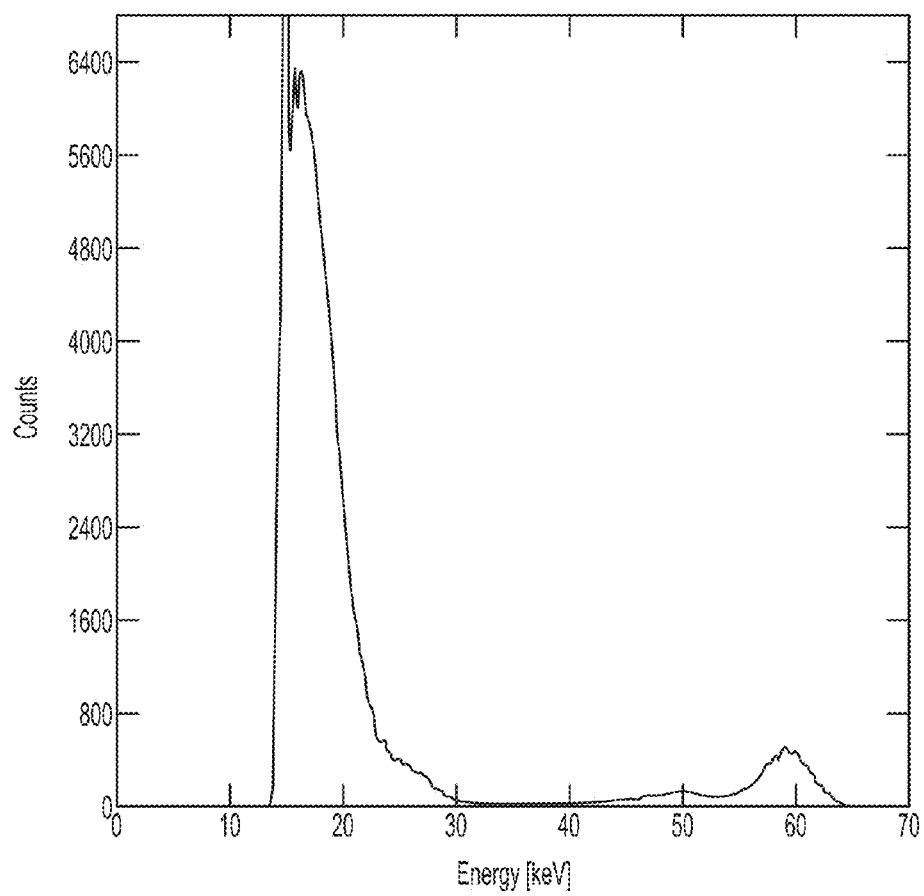
FIG. 9 illustrates an Am-241 spectrum taken with a strip detector, double-sided etched curved detector.

According to related U.S. Pat. No. 7,968,959, different depth trenches, such as depicted to each trench 1614 are introduced on the front- and the backside of a 1 mm thick silicon wafer. Each side of each trench 1614 is etched in a single DRIE etching step. These trenches (such as each trench 1614) were etched in a single DRIE process using a gray-tone photo-resist (U.S. Pat. No. 7,968,959 [col. 5, ll. 53-58]); therefore, it can be understood by one of ordinary skill in the art that according to the gray tone technology process, after etching, it follows inherently, that the remaining substrate thickness depends on the original thickness of the photoresist, where in the RIE and/or DRIE etching process, which is used to transfer the resist into a 3D silicon material profile [see FIG. 2 of related U.S. Patent Application US2009/0092934 herein incorporated by reference], the masking material will be simultaneously etched along with the substrate (also, see related application US2009/0092934 paragraph [0038] ([additional support for the transfer of the resist into a 3D silicon material, see FIG. 2 of the instant invention). Therefore, in other words, it can be understood by one of skill in the art in the RIE and/or DRIE etching process, it is inherent that an etch rate of masking material, such as photo resist, may be many times lower than the etch rate of silicon, where a ratio of the etch rate of silicon to the etch rate of photo resist is the etch selectivity, and where the etch selectivity in gray tone technology is important to control because the difference in etch rates of two materials causes an amplification of all vertical dimensions, as indicated in FIG. 2 of related patent US12009/0092934 herein incorporated by reference [also see the instant application figures: FIG. 2 and FIG. 8 of the instant invention].

When the silicon is shaped using gray tone technology accordingly to the needed radius of curvature, a focal plan array can be fabricated using standard silicon micro fabrication operations, thus facilitating the production of gamma ray detector technology on a curved silicon surface. A simplified silicon shaping process is illustrated in FIG. 4.

Figure 4:
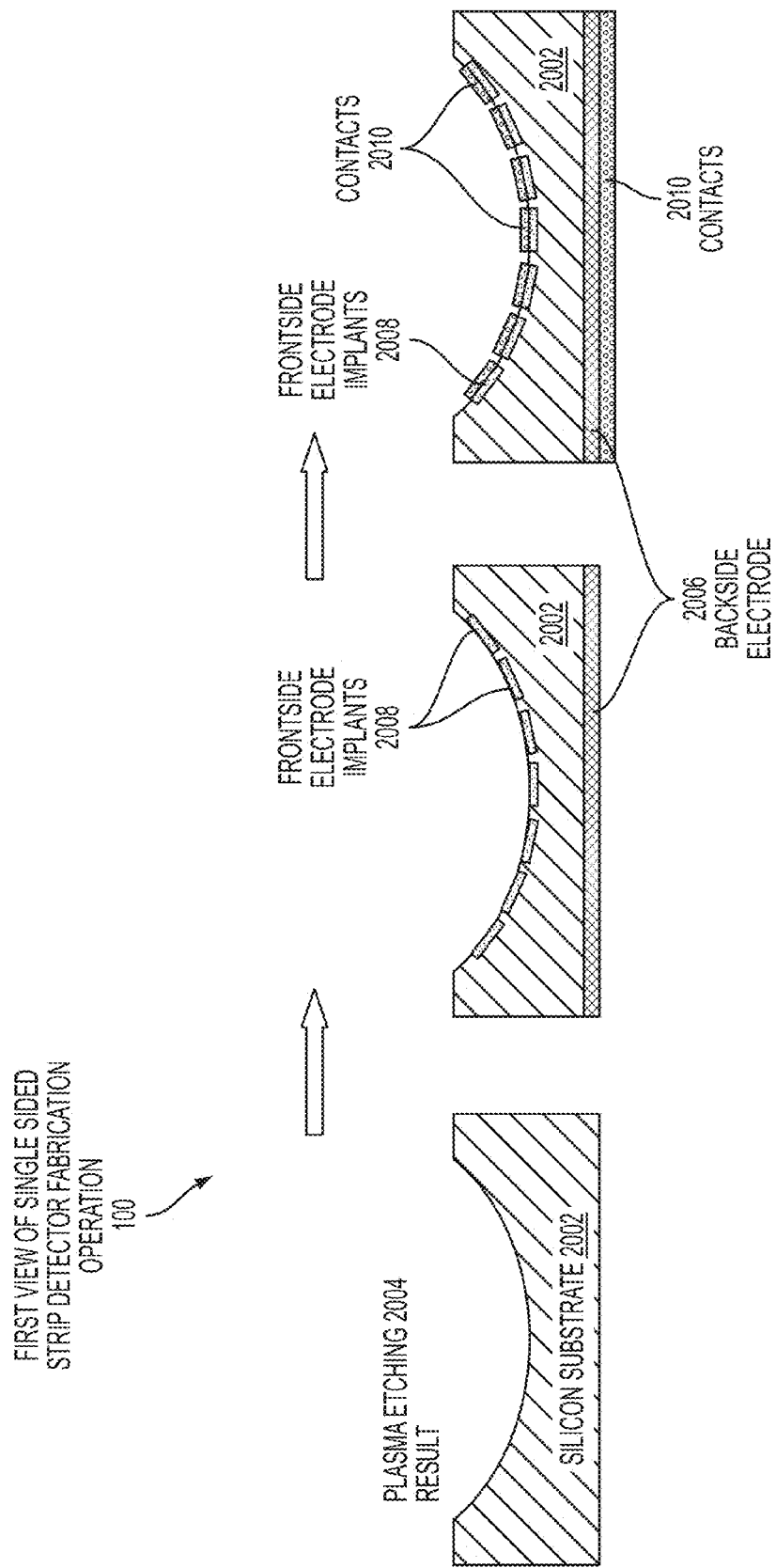
FIG. 4 illustrates how after transferring the resist profile into silicon, a single-sided strip detector is fabricated using ion-implantation.

Referring to a $1^{st}$ view of single sided strip detector fabrication steps 100 FIG. 4 shows how after transferring the resist profile into silicon, a single-sided strip detector is fabricated using ion-implantation. The lithography steps are performed with a "spray-on-resist". Also please see the first embodiment 500 steps shown in FIG. 20.

Referring again to the $1^{st}$ view of single sided strip detector fabrication steps in FIG. 4, using exemplary embodiment processes, curved, strip and pixel detectors are fabricated with low leakage current and energy resolution. The detectors are curved, by transferring the resist profile into silicon and further using ion-implantation, along with lithography steps, to a specific curvature and shaped directly for the specific application; such an application can be a beam pipe radius.

When the lithography operations are performed with a spray on resist; even though the surface is not as smooth as a planar wafer, good charge collection is achieved. A pixel array is fabricated on a half pipe. The energy resolutions is 2.53 keV FWHM at 59 keV.

Figure 5:
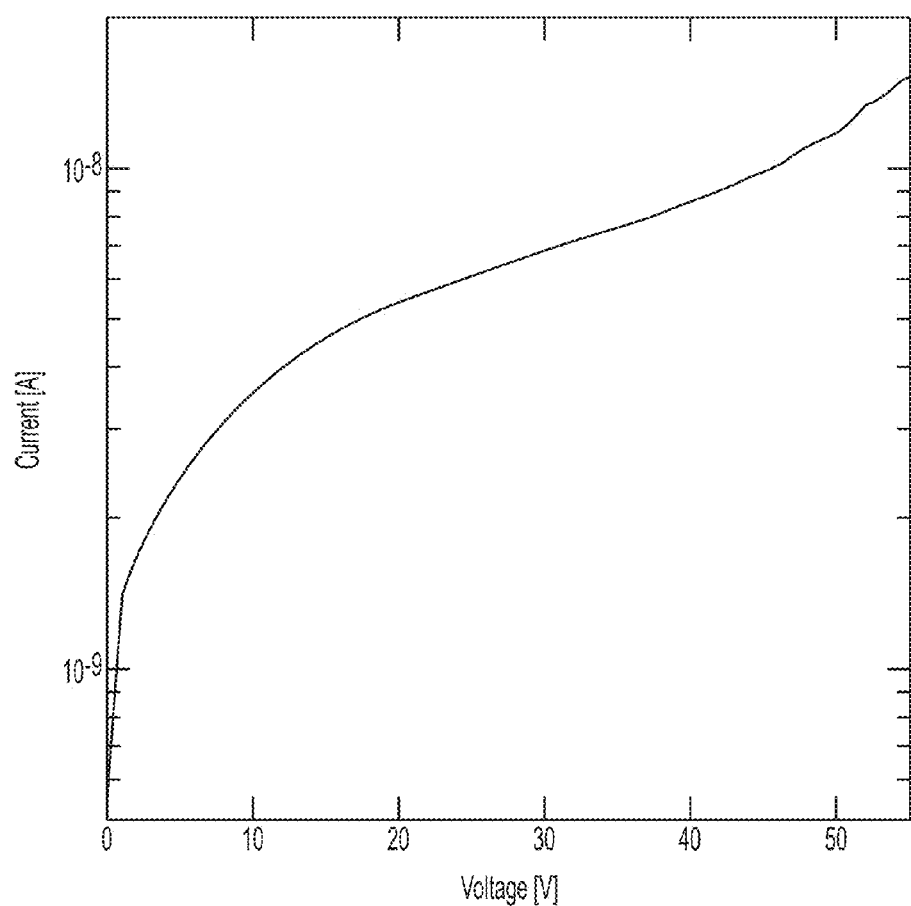
FIG. 5 illustrates leakage current from a curved strip detector.
Figure 6:
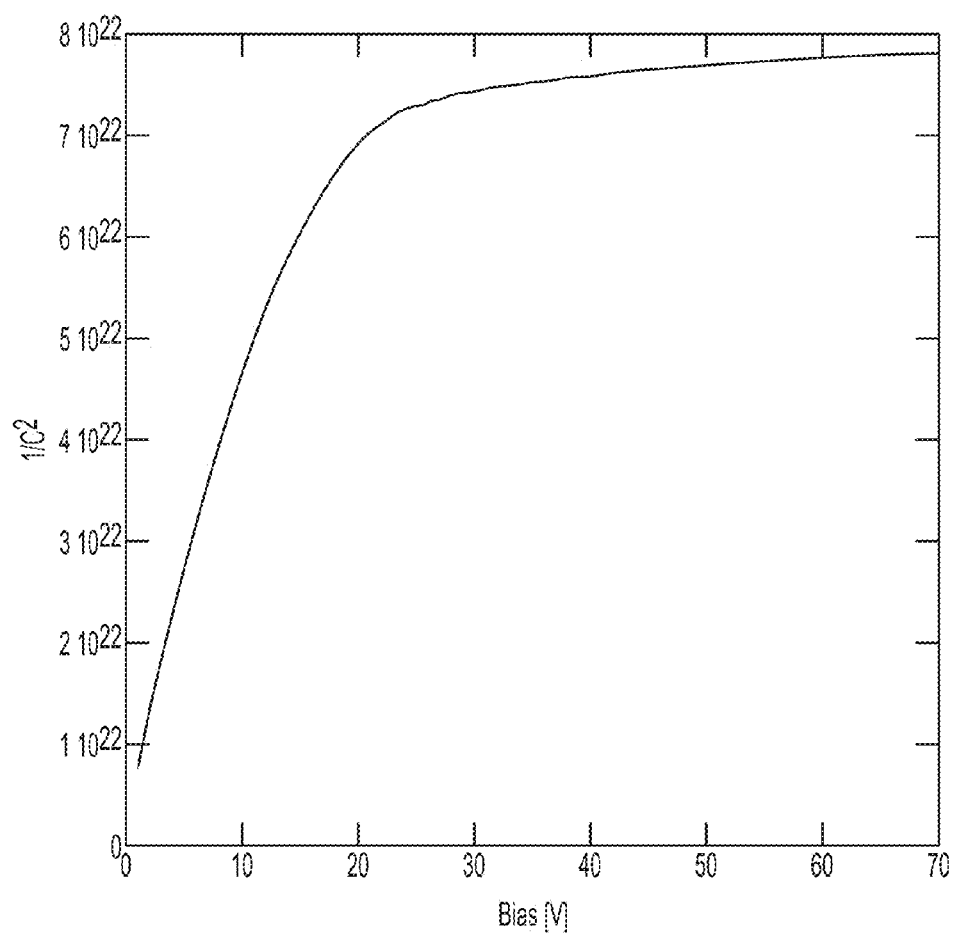
FIG. 6 illustrates a $1/C^2$ depletion plot of a curved strip detector (half pipe).
Figure 7A:
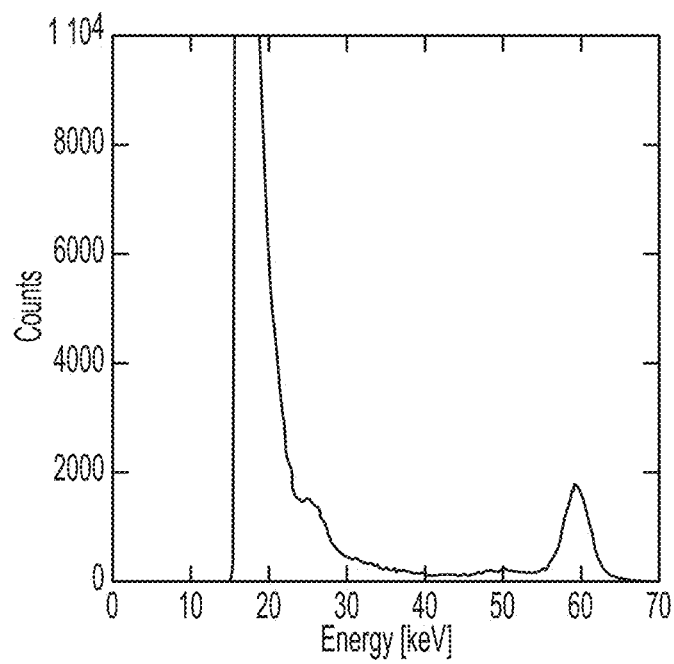
FIG. 7A illustrates an AM 241 spectrum taken with a strip detector, half pipe.
Figure 7B:
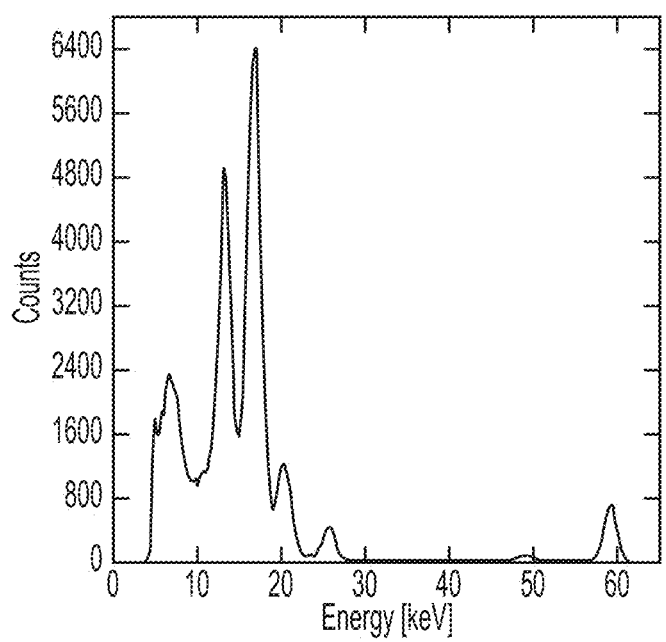
FIG. 7B illustrates an AM 241 spectrum taken with a pixel detector, half pipe.

FIG. 5 shows a current-voltage (IV) curve, illustrating leakage current from a curved strip detector with strip dimensions: 14×0.8 mm. FIG. 6 is a plot of the inverse of capacitance squared ($1/C^2$) verses a value of a bias voltage from a curved strip detector (half-pipe), where C is the capacitance of the device and V is the value of a bias voltage applied to the device. Analysis of a $1/C^2$ plot is used to determine if a device is fully depleted or not. FIG. 7A is an Am-241 photon spectrum from a curved detector (fully depleted) (see FIG. 16), showing 7.5 keV full width half maximum (FWHM) resolution at 59.5 keV. FIG. 7B is an Am-241 photon spectrum from a pixel on a curved detector.

Figure 19:
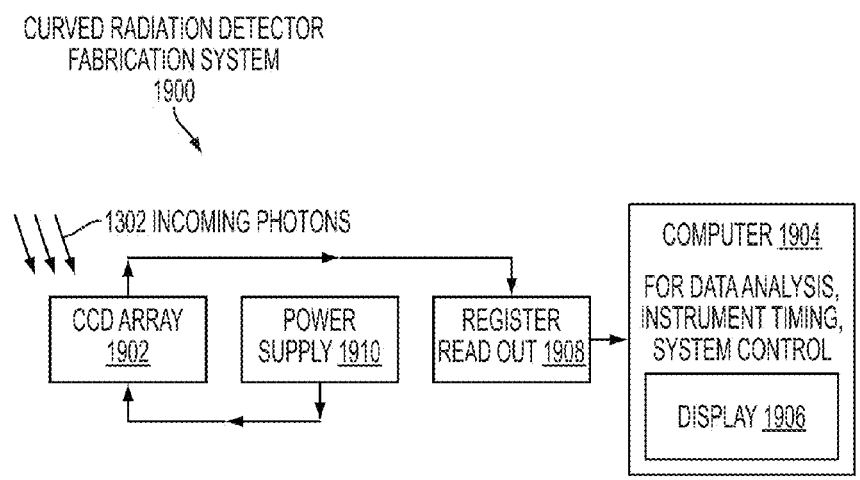
FIG. 19 illustrates a system used in the fabricating and testing of a curved radiation detector.

Referring to FIG. 19, in exemplary embodiments, system descriptions of electrical quantities can be determined and analyzed by performing finite element simulations and data collection and measurement by using power supply 1910, for applying potentials to the detectors, in conjunction with utilization of instrument control and analysis which can be effected using computer controllers, processors, analyzers and automated measurement instrumentation, such as illustrated in FIG. 19. The instrumentation and automated computer processors and analyzers include the power supply 1910, the register read out 1908, the computer 1904, along with display 1906 for data analysis, instrument timing, and system control.

The curvature of the backside is independent from the front surface, which allows thinning of the detector using standard semiconductor processing.

Figure 20:
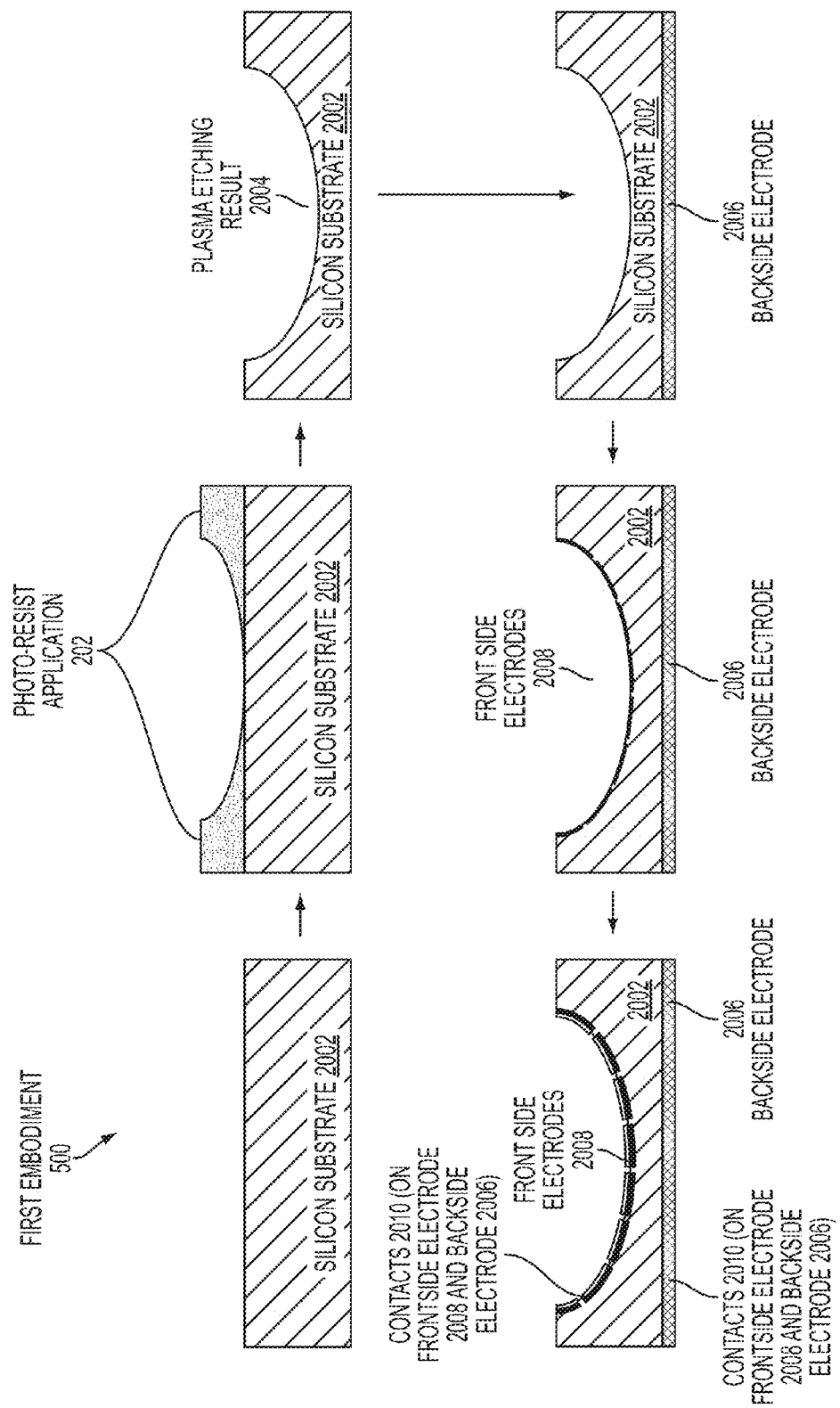
FIG. 20 illustrates a first embodiment 500 of a resulting single sided curved solid-state imaging device formed using gray tone lithography in combination with plasma etching processing.
Figure 21:
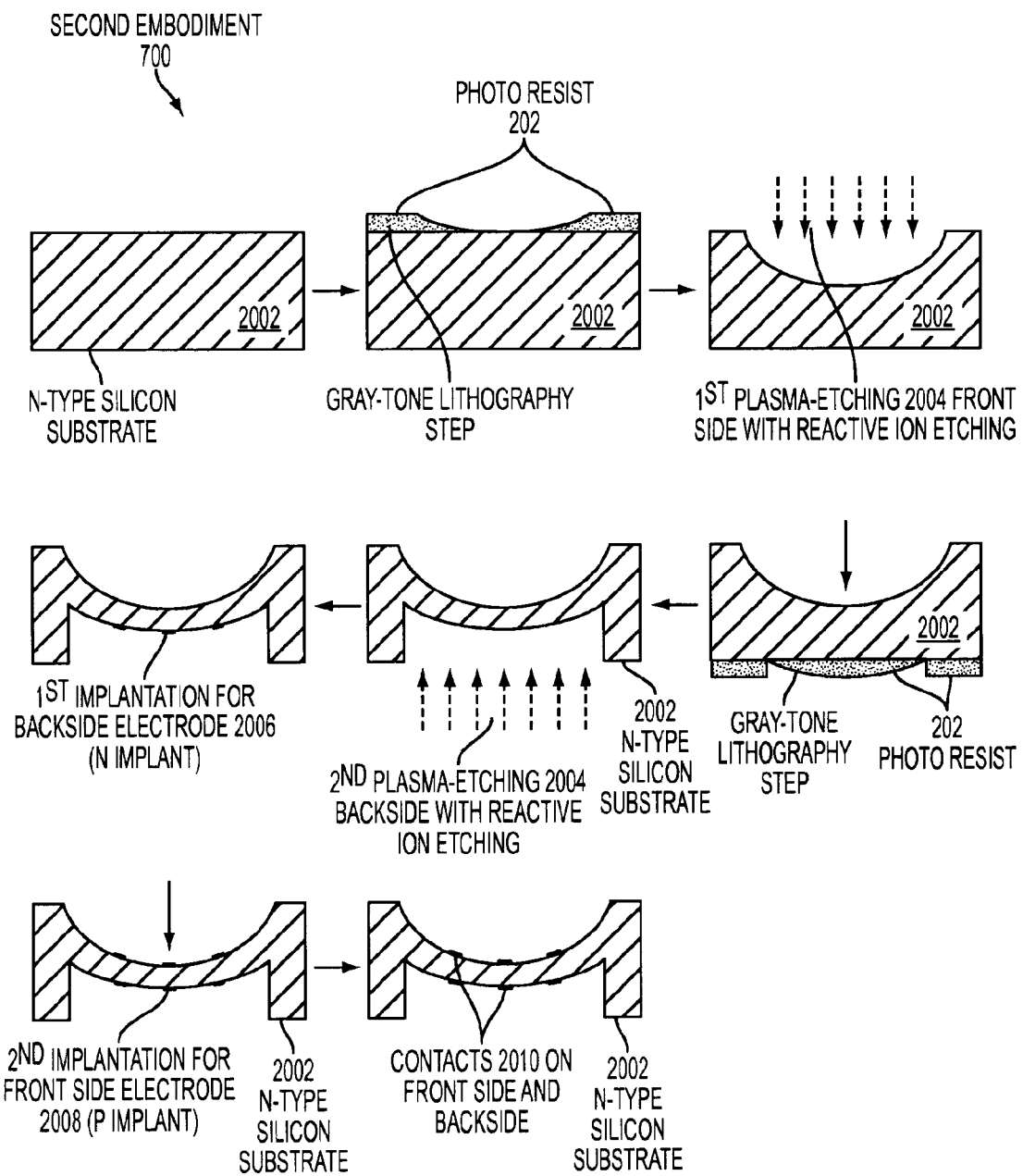
FIG. 21 illustrates a second embodiment 700 of a resulting double sided curved solid-state imaging device formed using gray tone lithography in combination with plasma etching processing.

In exemplary embodiments, gray-tone technology is used for double-side processing, see 2nd view: double sided strip detector fabrication steps 200 in FIG. 8. The remaining thickness is adjusted by the wafer thickness and plasma etch operations. A double-sided etched curved strip detector is fabricated in exemplary embodiments using gray-tone technology. Also, see the second embodiment 700 represented by the following figures: FIG. 20 and FIG. 21 shows an AM 241 spectrum taken with a strip detector as a double-sided etched curved detector, having an energy resolution of 5.77 keV FWHM at 59 keV. (The resolution for the strip detector is limited by the capacitance of the device).

Figure 10:
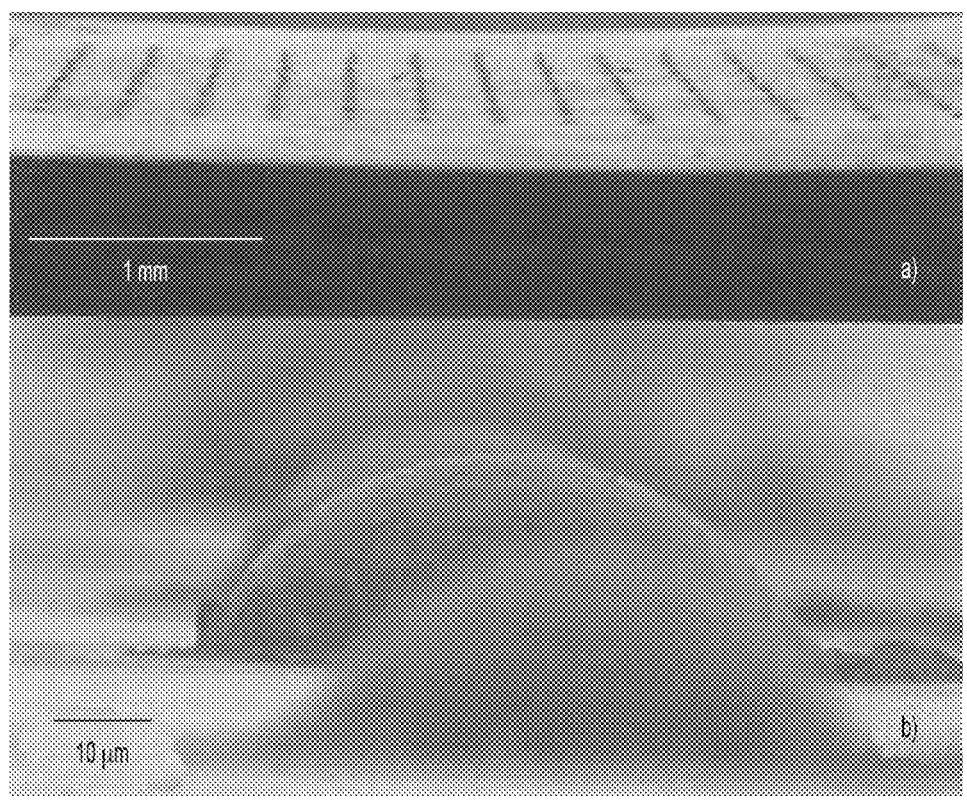
FIG. 10 illustrates indium bumps formed on a curved detector surface.
Figure 11:
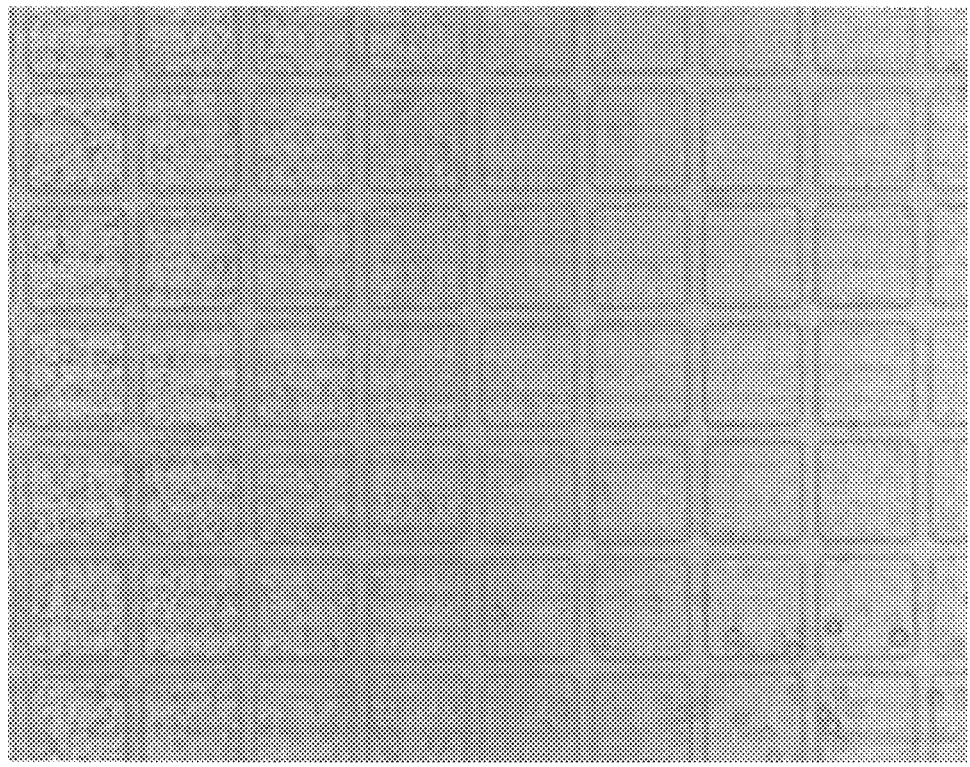
FIG. 11 illustrates an optical micrograph, top view, pixel array on a curved detector.
Figure 12:
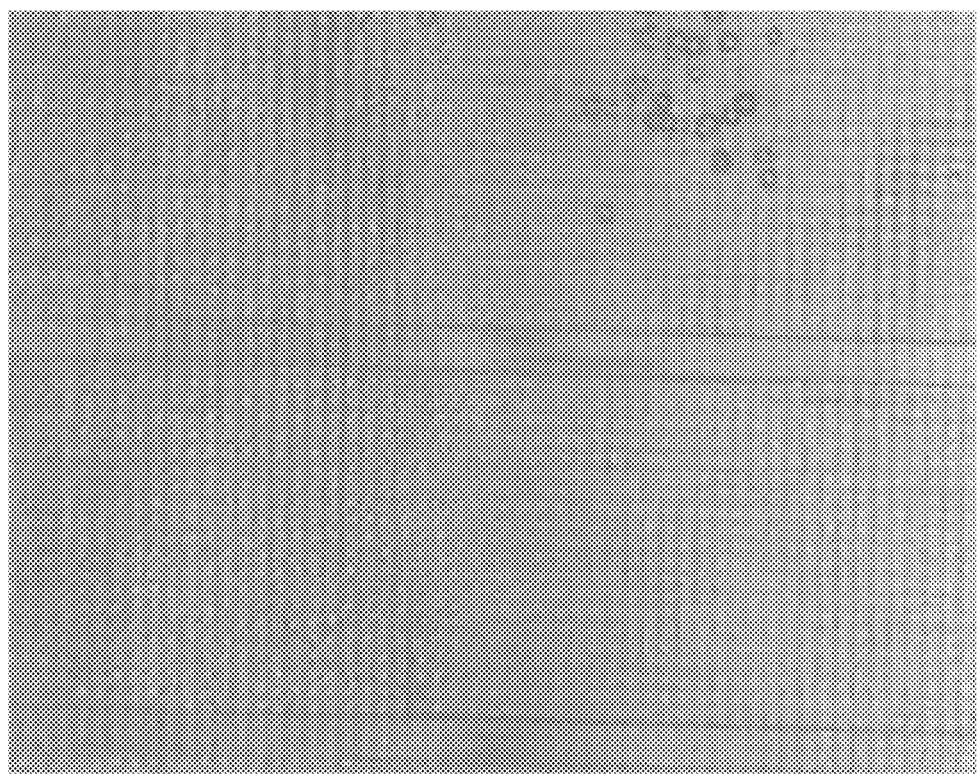
FIG. 12 illustrates an optical micrograph, top view, strip array on a curved detector.

In exemplary embodiments, most silicon fabrication operations are performed on a curved surface without any adjustments. Furthermore, most deposition techniques for metals and ion implantation for junction formation require no adjustments. Lithography on curved surfaces can be difficult; however, resist spray-on-coating circumvents this problem. FIG. 10 illustrates an array of Indium bumps on a curved silicon surface. Occurrences of indium bumps on the curved silicon surfaces can reduce the fluid dynamic effect of photo-resist 202 on the wafer as the photo-resist 202 droplets are supposed to stay where they are being deposited. During spray coating of the photo-resist 202, the wafer is rotated slowly while a swivel arm of a spray coating unit is moved across the wafer. A low spinner speed (30-60 rpm) is used to minimize the centrifugal force. The rotating also allows photo-resist 202 coverage in all the angles of the silicon topography. Patterns with a few μm can be successfully fabricated using spray-on resists on the curved surfaces. FIG. 10, FIG. 11 and FIG. 12 illustrate different examples from successful lithography on curved surfaces using photo-resist 202 sprayed-on the silicon surface. FIG. 11 is an optical micrograph, top view of a pixel array on a curved detector. FIG. 12 is an optical micrograph, top view of a strip array on a curved detector. Recall that FIG. 10 illustrates an array of Indium bumps on a curved silicon surface.

According to exemplary embodiments, standard methods of spin-coating can be applicable for some curved detectors, depending on the radius of curvature parameters. For a radius of curvature below 0.816 the thickness of the resist film applied by spin-coating is nearly homogenous over the sample. The photo-resist 202 coated lens is then lithographically exposed by a contact aligner. According to Radtke et al., Optics Express, 15, 1167 (2007) a lithography system with approximately 1 mm spot size and position accuracy less than or equal ($\leq$) to 150 nm of a curved surface is feasible.

Exemplary embodiments present new processes for obtaining a curved radiation detector by using gray-tone lithography. Gray-tone lithography is fully clean room compatible and CMOS front-end compatible. This is, for example, not the case for mechanical polishing; even CMP (chemical mechanical polishing) is not CMOS compatible. CMP is only used during "back-end" processing.

According to exemplary embodiments a curved substrate is fabricated first and then additional processing completes the full sensor device. In contrast to exemplary embodiments disclosed herein, all other published approaches first form the full sensor device, then thin it down and bend it. During thinning and bending processes, there is high risk of breaking the completed full sensor device; therefore, leading to very low yields.

According to exemplary embodiments, a curved CCD focal plane array is fabricated with back-and-front-side illuminated CCDs.

Further, pursuant to 37 CFR 1.57, additional material from U.S. Pat. No. 7,968,959, which is essential for completeness of the specification and enablement of the instant application and which was previously incorporated by reference is inserted into the specification as follows and contains no new matter: according to U.S. Pat. No. 7,968,959, in accordance with exemplary embodiments, a method and system are implemented in the fabrication of thick "silicon drift detectors" (SDDs) having significantly improved hard X-ray spectroscopy performance over current room-temperature semiconductor detectors; and the SDD fabrication described herein includes a fabrication method and a fabrication system which circumvent increasing voltage with the thickness of the SDD device. The fabrication method relies on gray tone lithography operations, which can be used in forming curved detectors by shaping silicon. A gray tone lithography operation is used in combination with a plasma etching operation to etch the silicon to a desired shape (i.e., physical configuration). A plurality of trenches (or holes) with different depths are etched into a semiconductor bulk material. These trenches allow for a lateral depletion, charge carrier collection, and "guide" the electrical carrier current to a small collecting electrode. The basic geometry is based on different depth holes or trenches (Geometries with non-penetrating trenches sometimes called "semi 3D detectors" (3D SDDs). In contrast to standard lithography, which leads to "black and white pattern", gray tone lithograph is used to structure a plurality of resist thicknesses. The combination of gray tone lithography and a dry reactive ion etch process can be applied to any semiconducting material. According to exemplary embodiments, the key to the realization of 3D SDDs is the microfabrication of the plurality of trenches 1614 (see U.S. Pat. No. 7,968,959 FIG. 16, to Christophersen et al.) having a plurality of different depth structures with well-defined curved surface contours. In exemplary embodiments, resist spray-coating is implemented.

CREATION OF ELECTRICAL JUNCTIONS Further, according to related U.S. patent application Ser. No. 12/581, 710 now U.S. Pat. No. 7,968,959 to Christophersen herein incorporated by reference, pursuant to 37 CFR 1.57, material from U.S. Pat. No. 7,968,959, which is essential for completeness of the specification and enablement of the instant application and which was previously incorporated by reference and are inserted into the specification as follows and contains no new matter: according to U.S. Pat. No. 7,968,959 and according to exemplary embodiments, at an operation forming junctions on the front side (i.e., operation 1412), a plurality of junctions on the front side of the semiconducting substrate 1602 in the form of a plurality of drifting electrodes on the front side are formed having different depths, by using gaseous Boron tribromide (BBr3) and a Boron solid source diffusion process. Further according to exemplary embodiments, at an operation forming electrical contacts (i.e., operation 1414) an electrical contact is formed on the collecting electrode 1608 and also a plurality of electrical contacts are formed on the plurality of drifting electrodes on the front and on the plurality of drifting electrodes on the back side of the semiconducting substrate 1602. After junction formation within the trenches (such as each trench 1614 (of U.S. Pat. No. 7,968,959, herein incorporated by reference) regular micro-fabrication operations are performed to form metal-contacts and surface passivation layers, where according to exemplary embodiments, fabricating a thick semiconductor drift detector method 1400 (of U.S. Pat. No. 7,968,959, herein incorporated by reference) is initiated at an operation where the thick semiconductor drift detector has a front side and a back side, including drift electrodes and a collecting electrode, using a gray tone lithography operation in combination with a plasma etching operation, and applying a plurality of voltages. Gray-tone lithography for photo-sculpting resist films includes a resin solution liquid positive photo resist on the front side and the back side of the silicon substrate for guard ring and drift cathodes, and mask etch. Further according to exemplary embodiments, plasma etching is used In combination with the gray-tone lithography, where the plasma etching operation includes plasma etching for drift cathodes on the front side of the silicon substrate; and plasma etching to open anodes. A plurality of cleaning operations include removal of organic contaminants, removal of a thin oxide layer, and removal of ionic contamination (i.e., RCA cleaning); and sulfuric acid hydrogen peroxide cleaning (Piranha cleaning). Further, according to exemplary embodiments, deep reactive ion etching includes using the resin solution liquid positive photo resist as masking material and removing resist operations with oxygen plasma and acetone. According to exemplary embodiments, the method further includes washing the silicon substrate with wafer washer for water stain removal, spraying a resist coating on the silicon substrate, further includes spraying on resist to an open anode, spraying on resist on the front side and spraying on resist on the back side, evaporating on the front side and the back side using e-beam evaporation operations, performing final testing of the detectors and dicing the silicon substrate. According to exemplary embodiments, at an operation forming the collecting electrode in a semiconducting substrate, a collecting electrode (1608 of U.S. Pat. No. 7,968,959) is formed in the semiconducting substrate (1602 of FIG. 16 U.S. Pat. No. 7,968,959), on the front side of the semiconducting substrate (1602). According to exemplary embodiments, at an operation forming junctions inside the plurality of trenches (i.e., operation 1410), where, junctions are formed inside of each trench 1614 of drifting electrodes formed on the back side of the semiconducting substrate 1602. (See related U.S. Pat. No. 7,968,959 to Christophersen, col. 3, lines 18-37; col. 4, lines 21-33; col. 5, lines 1-10; col. 5, lines 42-45; col. 5, lines 51-55; col. 5, lines 56-58; col. 5, lines 65-67; col. 6, lines 1-12; col. 6, lines 16-21; col. 6, lines 5-6; col. 6, lines 22-25; col. 6, lines 27-32; col. 6, lines 33-38; col. 6, lines 46-59; col. 6, line 60 to col. 7, line 2; col. 7, lines 3-6; col. 7, lines 6-15; col. 7, lines 17-22; col. 7, lines 25-32; col. 7, lines 34-41; col. 7, lines 43-47; col. 7, lines 49-55; col. 7, lines 56-63; and col. 8, lines 36-45).

Figure 13:
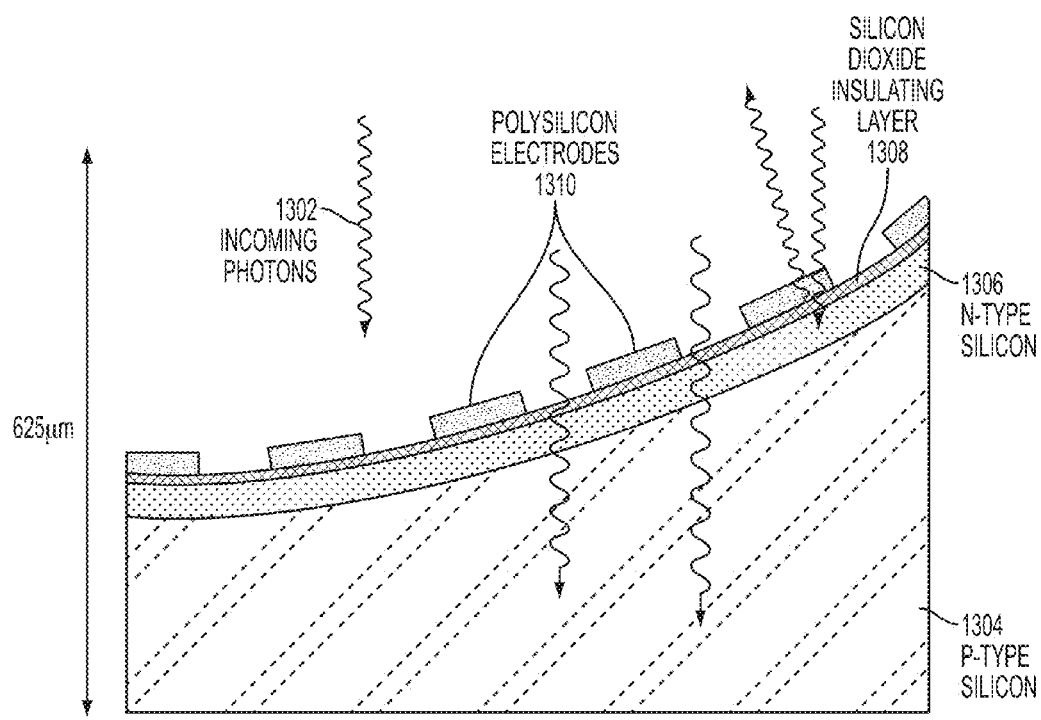
FIG. 13 illustrates a single side etched front side illuminated CCD.

Referring to FIG. 20, a first exemplary embodiment 500 describes a preferred embodiment and a preferred method of fabrication where (i) a single side-etched front side illuminated CCD is formed, and where the silicon front side is etched to the desired shape (see FIG. 13), then the electrical active pixel elements are fabricated on the front-side using standard lithography, direct laser writing and/or or e-beam patterning.

Figure 18:
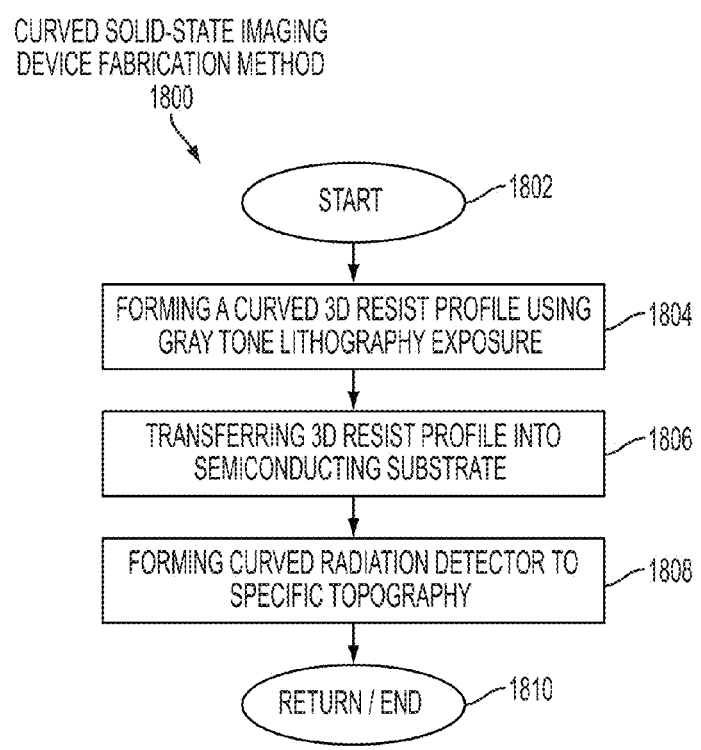
FIG. 18 illustrates method operations of fabricating a curved radiation detector.

Referring to FIG. 18, FIG. 19 and FIG. 20 (see First Embodiment 500), according to the first exemplary embodiment 500t, fabricating a curved solid-state imaging device method 1800 (hereafter "the method 1800") is initiated at an operation start 1802. This method 1800 is utilized to fabricate the curved solid state imaging device in the form of any one or more of a curved charged coupled device (CCD) 1902 or a CMOS imager, or a photoelectric conversion element, a radiation detector, an X-ray detector and/or a nuclear radiation detector.

Again referring to FIG. 18, FIG. 19 and FIG. 20 (see First Embodiment 500) and further according to the first exemplary embodiment 500, at an operation forming a curved three dimensional (3D) resist profile in photo resist 202 using a gray tone lithography exposure 1804, (hereafter "the method 1804") the method 1800 is conducted by implementing a gray tone lithography operation in combination with a plasma etching operation, to form the CCD 1902, where gray tone lithography is used to structure a plurality of photo-resist thicknesses. In other words, gray tone lithography is a cost effective way to produce reproducible 3D photo resist patterns with continuously varying depth of the photo resist pattern, where it follows inherently that these patterns either form the final structure or are used as masks or molds which are transferred into the appropriate semiconducting material, and where it further follows that gray tone technology inherently facilitates creation of 3D curved structures, based on the different depth photo resist patterns from which exposed photoresist may be developed. See U.S. Pat. No. 7,968,959 col. 6, lines 5-8, herein incorporated by reference.

Again referring to FIG. 18, FIG. 19 and FIG. 20, (see First Embodiment 500) and further according to the first exemplary embodiment 500, at an operation transferring the 3D resist profile into a semiconducting substrate 1806 (hereafter "the operation 1806") a curved 3D resist profile is transferred from the surface of a semiconducting substrate which can be a silicon substrate 2002 into the semiconducting substrate to produce a three dimensional structure in the photoresist, and where the photoresist mask slowly erodes, exposing the underlying silicon to the high etch rate plasma. Thus gray tone technology DRIE recipes control the relative etch rate of silicon to define the final dimensions of a 3D structure in silicon. Different depth trenches, such as depicted by each trench 1614 are introduced on the front- and the backside of a 1 mm thick silicon wafer. Each side of each trench 1614 is etched in a single DRIE etching step. These trenches (such as each trench 1614) were etched in a single DRIE process using a gray-tone photo-resist (U.S. Pat. No. 7,968,959 [col. 5, ll. 53-58]); therefore, it can be understood by one of ordinary skill in the art that according to the gray tone technology process, after etching, it follows inherently, that the remaining substrate thickness depends on the original thickness of the photo-resist, where in the RIE and/or DRIE etching process, which is used to transfer the resist into a 3D silicon material profile [FIG. 2 of US2009/0092934], the masking material will be simultaneously etched along with the substrate (also, see related pending application US2009/0092934 paragraph [0038]) ([additional support for the transfer of the resist into a 3D silicon material, see FIG. 2A now as amended FIG. 2B of the original drawings and see paragraphs [0014] & [0015] of the original specification]). Therefore, in other words, it can be understood by one of ordinary skill in the art in the RIE and/or DRIE etching process, it is inherent that an etch rate of masking material, such as photo resist, may be many times lower than the etch rate of silicon, where a ratio of the etch rate of silicon to the etch rate of photo resist is the etch selectivity, and where the etch selectivity in gray tone technology is important to control because the difference in etch rates of two materials causes an amplification of all vertical dimensions, as indicated in FIG. 2 of related pending patent US2009/0092934 [support for the amplification is found in the original drawings of the instant application in FIG. 8 (see the $2^{nd}$ View: Double Sided Strip Detector Fabrication Operation 200)].

Again referring to FIG. 18, FIG. 19 and FIG. 20, (see First Embodiment 500) and further according to the first exemplary embodiment 500, at an operation forming a curved radiation detector to specific topography 1808, (hereafter "the operation 1808"), the silicon substrate 2002 or the semiconducting substrate which can be any one or more of silicon and/or compound semiconductors such as Gallium Arsenide (GaAs), Indium phosphide (InP), and/or Silicon carbide (SiC), etc. is exposed to a reactive ion etching operation; thus, forming the curved solid state imaging device, which as stated above, can include any one or more of a curved charged coupled device (CCD) 1902 or a CMOS imager, or a photoelectric conversion element, a radiation detector, an X-ray detector and/or a nuclear radiation detector, as implemented in the operation. When the silicon is shaped using gray tone technology accordingly to the needed radius of curvature, a focal plane array can be fabricated using standard silicon micro fabrication operations, thus facilitating the production of gamma ray detector technology on a curved silicon surface. A simplified silicon shaping process sequence is illustrated in FIG. 4.

Thus, as described above, and according to the first exemplary embodiment 500, the method 1800 comprises forming a plurality of 3D resist profiles by spraying photo resist 202 onto a plurality of semiconducting substrates and further exposing the semiconducting substrates to a plurality of gray tone lithography operations, thereby, transforming the silicon semiconducting substrate into a silicon semiconductor device.

Again referring to FIG. 18, FIG. 19 and FIG. 20 (see First Embodiment 500) and further according to the first exemplary embodiment 500, the method 1800 including transferring the 3D resist profile into the semiconducting substrate, further includes transforming the silicon semiconducting substrate into a silicon semiconductor device which is a charged coupled device (CCD) array, where the CCD array is composed of low doped silicon; furthermore, the CCD array is a back-side illuminated device, and curvature of the backside is independent from a front surface, which allows thinning of the curved solid-state imaging device using standard semiconductor processing. The combination of gray tone lithography and a dry reactive ion etch process can be applied to any semiconducting material. According to exemplary embodiments, the key to the realization of 3D SDDs is the micro-fabrication of the plurality of trenches 1614 of U.S. Pat. No. 7,968,959 FIG. 16 having a plurality of different depth structures with well-defined curved surface contours.

According to the first exemplary embodiment 500, the method 1800 further comprises performing a second lithography operation on the semiconducting substrate etched by the reactive ion etching operation, where the semiconducting substrate is a 3D silicon structure.

Referring to FIG. 18 and FIG. 20 of the instant invention and further referring to U.S. Pat. No. 7,968,959 to Christophersen et al., herein incorporated by reference, according to the first exemplary embodiment 500, the method 1800 further comprises structuring a plurality of electrical junctions by implanting ions into active regions (where junctions are defined and/or formed by doping level variations into active regions or Schottky contacts) on the 3D silicon structure, and where the plurality of electrical junctions can form either a pixel array and/or a strip array. According to exemplary embodiments, at an operation forming junctions on the front side (i.e., operation 1412), a plurality of junctions on the front side of the semiconducting substrate 1602 in the form of a plurality of drifting electrodes on the front side are formed having different depths, by using gaseous Boron tribromide (BBr3) and a Boron solid source diffusion process. After junction formation within the trenches (such as each trench 1614 regular micro-fabrication operations are performed to form metal-contacts and surface passivation layers, where according to exemplary embodiments, fabricating a thick semiconductor drift detector method 1400 (of U.S. Pat. No. 7,968,959) is initiated at an operation where the thick semiconductor drift detector has a front side and a back side, including drift electrodes and a collecting electrode, using a gray tone lithography operation in combination with a plasma etching operation, and applying a plurality of voltages. Gray-tone lithography for photo-sculpting resist films includes a resin solution liquid positive photo resist on the front side and the back side of the silicon substrate for guard ring and drift cathodes, and mask etch. Further according to exemplary embodiments, plasma etching is used in combination with the gray-tone lithography, where the plasma etching operation includes plasma etching for drift cathodes on the front side of the silicon substrate; and plasma etching to open anodes. A plurality of cleaning operations include removal of organic contaminants, removal of a thin oxide layer, and removal of ionic contamination (i.e., RCA cleaning); and sulfuric acid hydrogen peroxide cleaning (Piranha cleaning). Further, according to exemplary embodiments, deep reactive ion etching includes using the resin solution liquid positive photo resist as masking material and removing resist operations with oxygen plasma and acetone. According to exemplary embodiments, the method further includes washing the silicon substrate with wafer washer for water stain removal, spraying a resist coating on the silicon substrate, further includes spraying on resist to an open anode, spraying on resist on the front side and spraying on resist on the back side, evaporating on the front side and the back side using e-beam evaporation operations, performing final testing of the detectors and dicing the silicon substrate. According to exemplary embodiments, at an operation forming the collecting electrode in a semiconducting substrate, a collecting electrode (1608) is formed in the semiconducting substrate (1602 of FIG. 16), on the front side of the semiconducting substrate (1602). According to exemplary embodiments, at an operation forming junctions inside the plurality of trenches (i.e., operation 1410), where junctions are formed inside of each trench 1614 of drifting electrodes formed on the back side of the semiconducting substrate 1602. (See related U.S. Pat. No. 7,968,959 to Christophersen, col. 3, lines 18-37; col. 4, lines 21-33; col. 5, lines 1-10; col. 5, lines 42-45; col. 5, lines 51-55; col. 5, lines 56-58; col. 5, lines 65-67; col. 6, lines 1-12; col. 6, lines 16-21; col. 6, lines 5-6; col. 6, lines 22-25; col. 6, lines 27-32; col. 6, lines 33-38; col. 6, lines 46-59; col. 6, line 60 to col. 7, line 2; col. 7, lines 3-6; col. 7, lines 6-15; col. 7, lines 17-22; col. 7, lines 25-32; col. 7, lines 34-41; col. 7, lines 43-47; col. 7, lines 49-55; col. 7, lines 56-63; and col. 8, lines 36-45).

Further according to the first exemplary embodiment 500, the method 1800 further comprises structuring a plurality of electrical contacts, such as contact 2010 (see FIG. 20) on the 3D silicon structure, where the plurality of electrical contacts 2010 are ohmic contacts. Further according to exemplary embodiments, at an operation forming electrical contacts (i.e., operation 1414) an electrical contact is formed on the collecting electrode 1608 and also a plurality of electrical contacts are formed on the plurality of drifting electrodes on the front and on the plurality of drifting electrodes on the back side of the semiconducting substrate 1602. (See related U.S. Pat. No. 7,968,959 to Christophersen herein incorporated by reference, see col. 3, lines 18-37; col. 4, lines 21-33; col. 5, lines 1-10; col. 5, lines 42-45; col. 5, lines 51-55; col. 5, lines 56-58; col. 5, lines 65-67; col. 6, lines 1-12; col. 6, lines 16-21; col. 6, lines 5-6; col. 6, lines 22-25; col. 6, lines 27-32; col. 6, lines 33-38; col. 6, lines 46-59; col. 6, line 60 to col. 7, line 2; col. 7, lines 3-6; col. 7, lines 6-15; col. 7, lines 17-22; col. 7, lines 25-32; col. 7, lines 34-41; col. 7, lines 43-47; col. 7, lines 49-55; col. 7, lines 56-63; and col. 8, lines 36-45).

According to the first exemplary embodiment 500, the operation 1806 of transferring the 3D resist profile into the semiconducting substrate with the reactive ion etching operation forming the curved solid state imaging device, further includes forming the curved solid state imaging device to a specific topography, and the curved solid state device is a curved radiation detector.

Referring to, FIG. 18, FIG. 19 and FIG. 20 (see First Embodiment 500), and according the first exemplary embodiment 500, a curved solid-state imaging device formed from a gray-tone lithography operations combined with reactive ion etching operations on a curved surface, includes a semiconducting substrate, such as a silicon substrate 2002, etched to a required shape and a required radius.

Again referring to FIG. 18, FIG. 19 and FIG. 20 and FIG. 21—(see Second Embodiment 700), and according to the second exemplary embodiment 700, the curved solid-state imaging device further comprises a plurality of electrical junctions, including backside electrodes such as backside electrode 2006, formed by implanting ions into active regions on the semiconducting substrate, where the semiconducting substrate can be the silicon substrate 2002. The plurality of electrical junctions form one or more of either a pixel array and/or a strip array. Thus forming: A curved solid-state imaging device having a curved substrate surface, the curved solid-state imaging device comprising: a semiconducting substrate having a dry etched structured required curved shape and having a dry etched structured required radius; a plurality of electrical junctions, having implanted ions in active regions on the semiconducting substrate; and a plurality of electrical contacts on the semiconducting substrate wherein the semiconducting substrate is composed of one of a silicon substrate and a compound substrate including one or more of Gallium arsenide (GaAs), indium phosphate (InP) and silicon carbide (SiC), and wherein the transferring a 3D resist profile into the semiconducting substrate, where the dry etched structured required curved shape and the dry etched structured required radius are etched into the semiconducting substrate by a gray-tone lithography combined with a plasma etch of the semiconducting substrate, and wherein the dry etched structured required curved shape of the curved substrate surface is free of mechanically structured compression.

Again referring to FIG. 18, FIG. 19 and FIG. 20 and FIG. 21 (see Second Embodiment 700), and furthermore, according to the second exemplary embodiment 700, the curved solid-state imaging device further comprises a plurality of electrical contacts, such as contacts 2010, on the frontside electrode 2008 and the backside electrode 2006 of the semiconducting substrate. The semiconducting substrate is composed of either a silicon substrate 2002 and/or a compound substrate including one or more of either Cadmium telluride (CdTe), Cadmium zinc telluride (CdZnTe), GaAs, InP and/or SiC, where SiC is a compound composed of silicon and carbon.

Again referring to FIG. 18, FIG. 19 and FIG. 20 and FIG. 21, further according to exemplary embodiments, the curved solid-state imaging device (such as a curved radiation detector) is formed by operations which include the method 1800 having operations implementing fabrication of the curved solid-state imaging device using the gray tone lithography operation in combination with a plasma etching operation and further including formation of a curved resist profile in photo resist 202 using gray tone lithography exposure, and transfer of the curved resist profile into a semiconducting substrate, such as silicon and/or compound semiconductors, such as CdTe, CdZnTe, GaAs, InP, SiC, etc. with the reactive ion etching operation.

Again according to exemplary embodiments, the curved solid-state imaging device can be formed as a curved three dimensional (3D) device having a concave and a convex structure.

Again according to exemplary embodiments, the curved radiation detector is formed as either, a photoelectric conversion element, an X-ray detector, a nuclear radiation detector, and/or a charged coupled device (CCD), or a focal plane array radiation detector.

Again referring to FIG. 18, FIG. 19 and FIG. 20 and FIG. 21 (see Second Embodiment 700), and furthermore, according to the second exemplary embodiment 700, the curved radiation detector further comprises a semiconductor substrate etched from the back-side, and where the semiconductor substrate is a silicon substrate, such as the silicon substrate 2002. Furthermore, the curved radiation detector is back-side illuminated.

Referring to FIG. 16, FIG. 18, FIG. 19 and FIG. 20 and FIG. 21, and furthermore, according to the exemplary embodiments, the curved radiation detector formed as the focal plane array radiation detector is fully depleted.

Again referring to FIG. 18, FIG. 19 and FIG. 20 and FIG. 21, and further according to exemplary embodiments, the focal plane array radiation detector is a high energy vertex detector, having layers with full circular symmetry.

Furthermore, according to exemplary embodiments, the focal plane array radiation detector is a CMOS imager.

Figure 14:
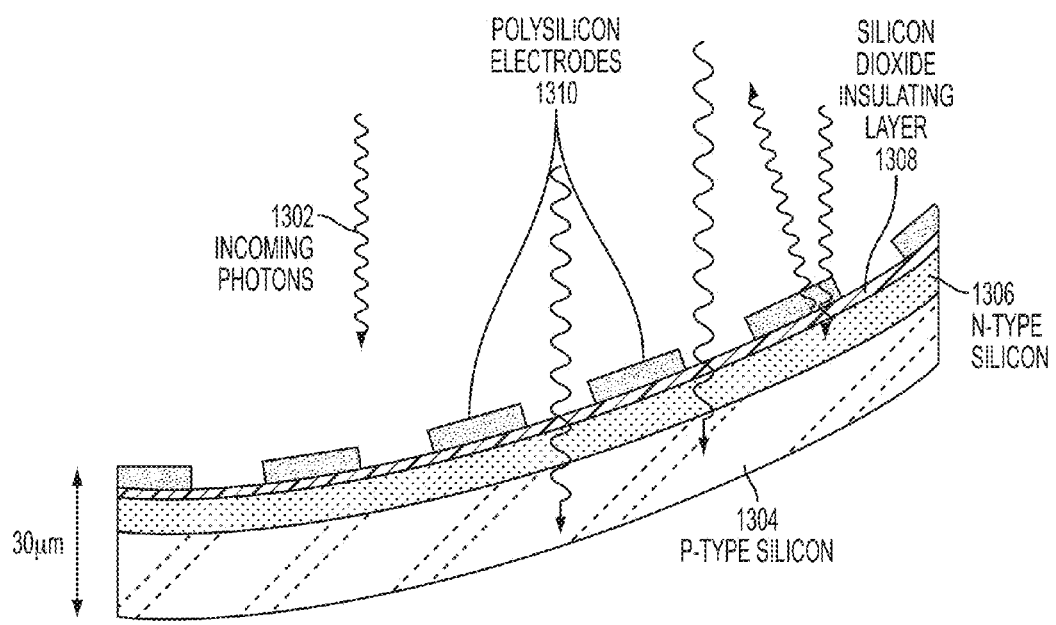
FIG. 14 illustrates a double side etched front side illuminated CCD.

Referring to FIG. 20 and FIG. 21, the second exemplary embodiment 700 describes (ii) a double-side etched back or front side illuminated CCD, where the silicon is etched from both sides, see FIG. 14. The resulting device can be front-or-back-side illuminated. The electrical active pixel elements are fabricated on the front-side using standard lithography, direct laser writing and/or e-beam patterning.

Figure 15:
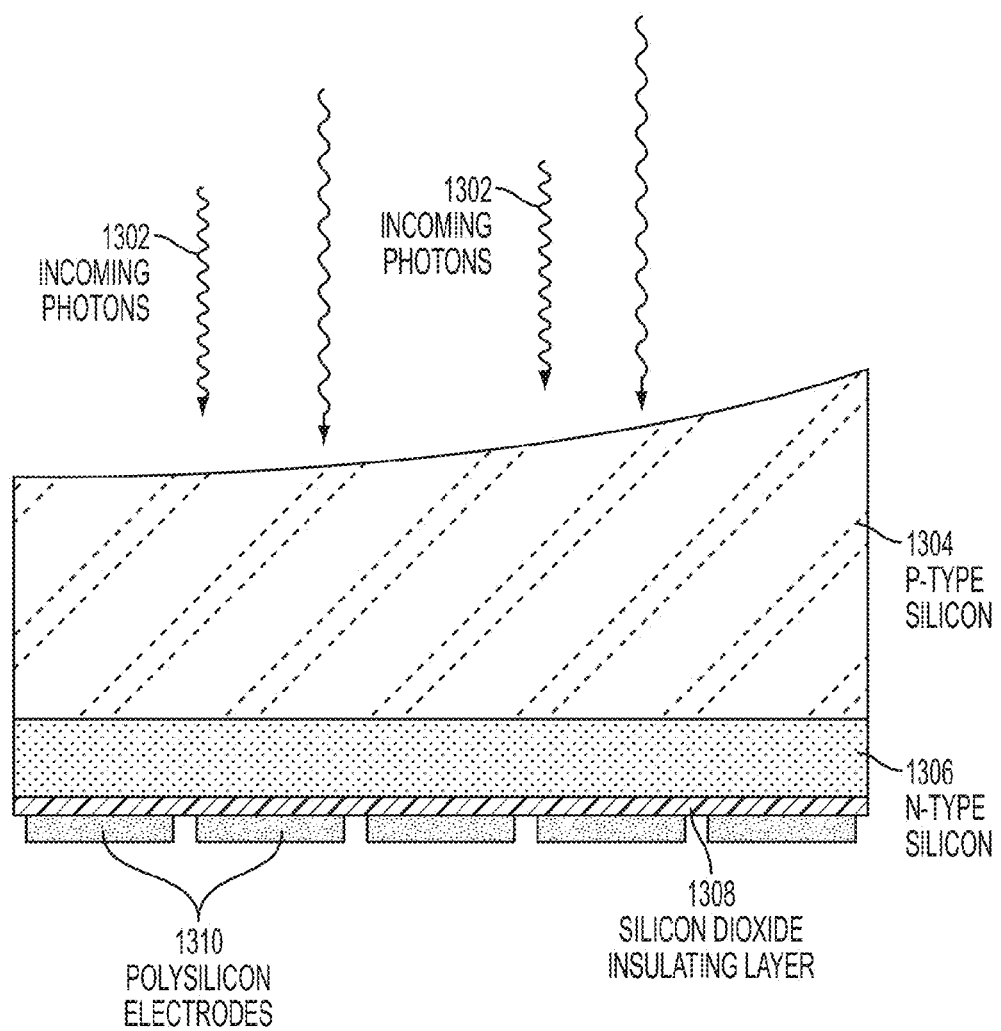
FIG. 15 illustrates a single side etched back side illuminated CCD.

A third exemplary embodiment describes (iii) a single side-etched back side illuminated CCD, where the back-side is etched down to the desired shape, see FIG. 15. The photons enter from the back-side. The advantage of this approach is that the CCD fabrication on the front-side can be standard processing.

Figure 16:
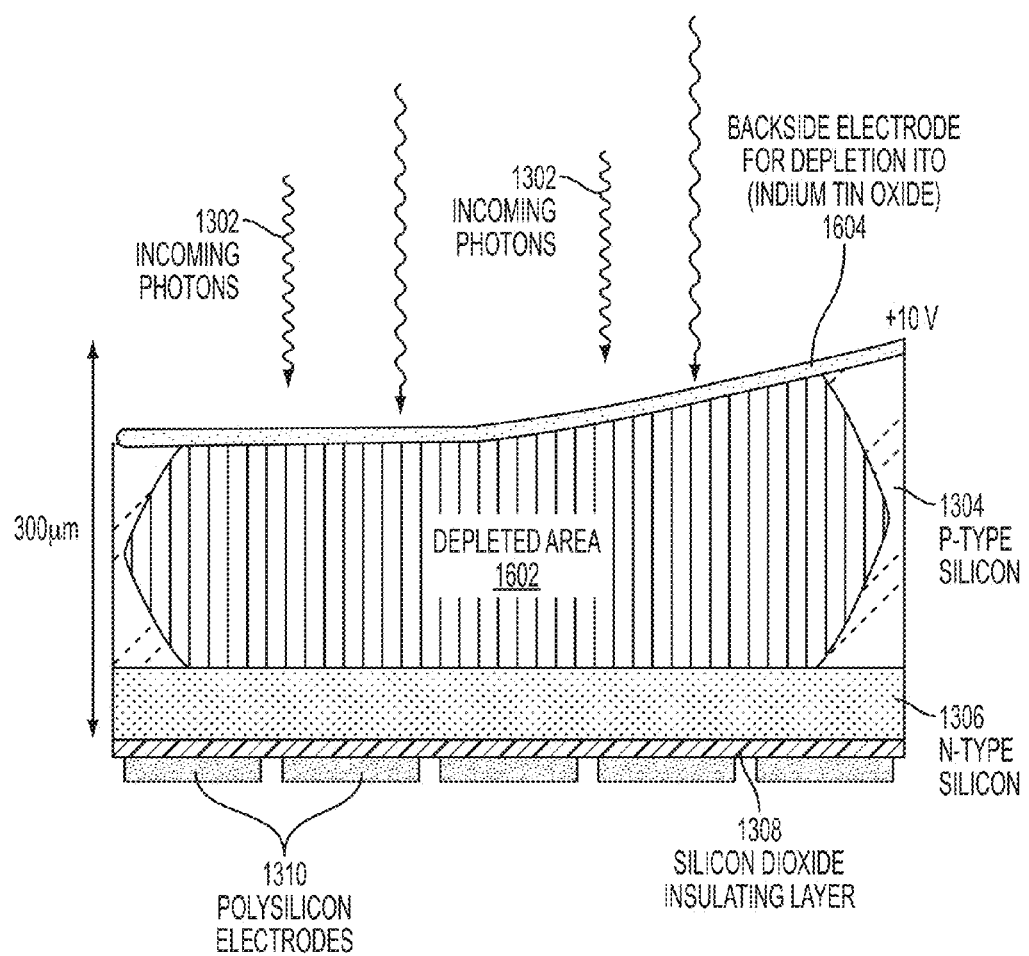
FIG. 16 illustrates a single side etched back side illuminated fully depleted CCD.

A fourth exemplary embodiment describes (iv) a fully depleted single side-etched back side illuminated CCD, where a fully depleted single side-etched back side illuminated CCD is the same as the single side-etched back side illuminated CCD described in the third exemplary embodiment (iii) (see FIG. 16); however, an additional electrode, such as a polysilicon backside electrode 1310 for depletion ITO (Indium Tin Oxide), will fully deplete the bulk of the detector, see FIG. 16. If the additional electrode needs to be transparent ITO, a transparent conductor, is used. The structure is similar to that discussed in U.S. Pat. No. 6,985,184 and U.S. Pat. No. 6,259,085; exemplary embodiments include a curved backside. Thus, at least two advantages are derived: Firstly, the light position will be more accurate because the charge will not spread while traveling from the backside to the front-side bucket array. Secondly, the worst case would be a 400 nm light (absorbed within 0.1-0.2 μm) 300 μm thick Si and the resulting charge spreading would be only 10 μm at full depletion. Furthermore, the CCD fabrication is conducted using standard processing.

Figure 17A:
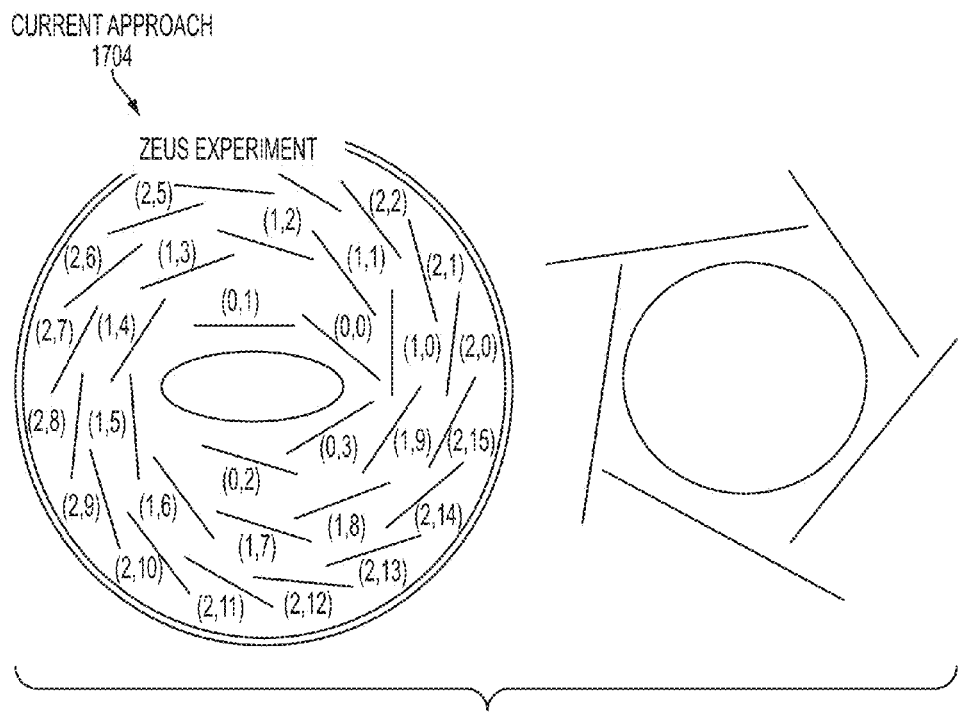
FIG. 17A illustrates schematics of current techniques of different detector agreements around the beam line and of different curved detectors.
Figure 17B:
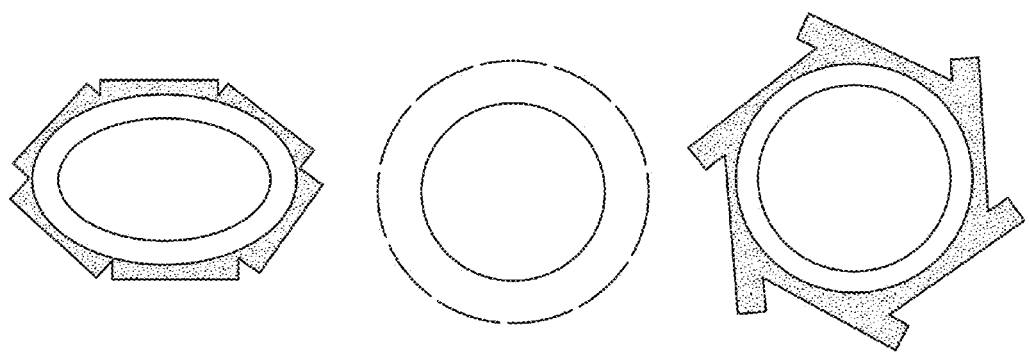
FIG. 17B illustrates schematics of techniques of different detector agreements around the beam line and of different curved detectors herein described as exemplary embodiments.

While the exemplary embodiments have been particularly shown and described with reference to preferred embodiments thereof, it will be understood by those skilled in the art that the preferred embodiments including a first, second, third and/or fourth exemplary embodiments have been presented by way of example only, and not limitation; furthermore, various changes in form and details can be made therein without departing from the spirit and scope of the invention. For example, curved charged particle detectors can also be used as charge particles around a beam-line in a high energy physics experiment. FIG. 17 shows the current approach used to arrange planar silicon detectors around a beam line. With the beam line radius further decreasing this arrangement becomes challenging, especially for elliptical beam lines. FIG. 15 also shows schematically the approach of the exemplary embodiments described herein. The radius of curvature and overall shape of the individual detector can be adjusted. The more systematic arrangements allow for an easier mechanical assembly and better tracking.

Also, in exemplary embodiments, gray-tone technology will work, in principle, with any material that can be DRIE-etched. For example dry etch recipes for potentially novel detector materials like Gallium Nitride (GaN) and SiC have been published; and instead of spray-on resist, also e-beam lithography or direct laser-writing could be use to do the lithography on the curved topography. In both techniques the software utilized in the method operations can adjust for the focus point during resist exposure.

Thus, the breadth and scope of the present exemplary embodiments should not be limited by any of the above described preferred exemplary embodiments, but should be defined only in accordance with the following claims and their equivalents. All references cited herein, including issued U.S. patents, or any other references, are each entirely incorporated by reference herein, including all data, tables, figures, and text presented in the cited references. Also, it is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one of ordinary skill in the art.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

What is claimed is:

1. A curved solid-state imaging device having a curved substrate surface, the curved solid-state imaging device comprising:
   a curved radiation detector having a semiconducting substrate having a dry etched structured required curved shape and having a dry etched structured required radius, wherein the dry etched structured required curved shape of the curved substrate surface of the curved radiation detector is free of mechanically induced curvature;
   a plurality of electrical junctions, having implanted ions in active regions on the semiconducting substrate of the curved radiation detector; and
   a plurality of electrical contacts on the curved solid-state imaging device's semiconducting substrate, wherein the semiconducting substrate of the curved radiation detector is composed of one of a silicon substrate and a compound substrate including one or more of Gallium arsenide (GaAs), indium phosphate (InP) and silicon carbide (SiC), wherein the curved radiation detector can be a vertex detector element, and can be a photoelectric conversion element, and can be an X-ray detector element, and can be a nuclear radiation detector element and wherein the dry etched structured required shape includes a range of required radii of curvature associated with a range of curvatures.

2. The curved solid-state imaging device according to claim 1, wherein the semiconducting substrate is a curved, three dimensional (3D) structure, and one of a concave and a convex structure.

3. The device according to claim 1, wherein the curved solid state imaging device includes one of a curved CMOS imager and a curved charged coupled device (CCD) and a curved focal plane array radiation detector, wherein the curved CCD further includes a single side etched one of a front side and a curved back side illuminated fully depleted CCD, wherein curvature of the curved back side illuminated fully depleted CCD is independent from the front side, wherein the CCD includes low doped silicon having a high resistivity semiconducting substrate, and wherein the curved back side illuminated fully depleted CCD includes an Indium Tin Oxide (ITO) electrode.

4. The device according to claim 1, wherein the curved substrate surface of the curved radiation detector includes a concave substrate surface and a convex substrate surface, wherein the plasma etch is a reactive ion etch, having a curved resist profile in photo resist with the gray tone lithography exposure in combination with transfer of the curved resist profile into the substrate surface of the semiconducting substrate, and wherein the semiconductor substrate is a back-side etched semiconductor substrate.

5. The device according to claim 1, further comprising the curved radiation detector, having one or more of a pixel array and a strip array in association with the plurality of electrical junctions.

6. The device according to claim 5, wherein the curved radiation detector includes curved silicon topographies of a vertex detector having layers with a full circular symmetry.

7. A method of fabricating a curved semiconducting device using a gray tone lithography operation in combination with a plasma etching operation, the method comprising:
   forming a curved three dimensional (3D) resist profile in photo resist using an exposure process involving the gray tone lithography operation; and
   transferring the curved 3D resist profile into a semiconducting substrate with a reactive ion etching operation forming a curved radiation detector, wherein the curved radiation detector has an ion etched structured required curved shape on at least one surface of the semiconducting substrate surface, wherein the ion etched structured required curved shape is free of mechanically induced curvature, wherein the curved radiation detector includes curved silicon topographies of a vertex detector and can be a photoelectric conversion element, and an X-ray detector, and a nuclear radiation detector element, and wherein the ion etched required curved shape includes a range of dry etched structured required radii of curvature, associated with a range of curvatures.

8. The method according to claim 7, further comprising forming a plurality of 3D resist profiles.

9. The method according to claim 7, further comprising exposing a plurality of gray tone lithography exposures.

10. The method according to claim 7, of transferring the 3D resist profile into the semiconducting substrate, wherein the semiconducting substrate is a silicon semiconductor device.

11. The method according to claim 7, of transferring the 3D resist profile into the semiconducting substrate, wherein the semiconducting device is a charged coupled device (CCD) array, wherein the CCD array is composed of low doped silicon having a high resistivity semiconducting substrate, and wherein the CCD array is a back-side illuminated CCD array, and wherein curvature of the back-side is independent from a front surface.

12. The method according to claim 7, further comprising performing a second lithography operation on the semiconducting substrate etched by the reactive ion etching operation, wherein the semiconducting substrate is a 3D silicon structure.

13. The method according to claim 7, further comprising structuring a plurality of electrical junctions by implanting ions into active regions on the 3D silicon structure, wherein the plurality of electrical junctions form one of a pixel array and a strip array.

14. The method according to claim 7, further comprising structuring a plurality of electrical contacts on the 3D silicon structure, wherein the plurality of electrical contacts are ohmic contacts.

15. The method according to claim 7, of transferring the 3D resist profile into the semiconducting substrate with the reactive ion etching operation forming the curved semiconducting device, further includes forming the curved semiconducting device to a specific topography of the curved radiation detector.

16. The device according to claim 1, wherein the curved radiation detector is a curved particle detector.

17. The device according to claim 1, wherein the range of curvatures can vary from about $0.816$ $cm^{-1}$ to about $0.001$ $cm^{-1}$, which corresponds to the range of required radii of curvature ranging from about 1.2 cm up to about 1000 cm, wherein 1.2 $cm=1/0.816$ $cm^{-1}$ and 1000 $cm=1/0.001$ $cm^{-1}$, and wherein a yield associated with said range of curvatures corresponding to said range of required radii of curvature is absent any deformations.

18. The method according to claim 7, wherein the range of curvatures varies from about $0.816$ $cm^{-1}$ to about $0.001$ $cm^{-1}$, which corresponds to the range of dry etched structured required radii of curvature ranging from about 1.2 cm up to about 1000 cm, wherein 1.2 $cm=1/0.816$ $cm^{-1}$ and 1000 $cm=1/0.001$ $cm^{-1}$, and wherein a yield associated with said range of curvatures corresponding to said range of dry etched structured required radii of curvature is absent any deformations.

* * * * *